United States Patent
Kim et al.

(10) Patent No.: US 8,004,311 B2
(45) Date of Patent: Aug. 23, 2011

(54) INPUT/OUTPUT CIRCUIT AND INTEGRATED CIRCUIT APPARATUS INCLUDING THE SAME

(75) Inventors: Joung Yeal Kim, Yongin-si (KR); Young Hyun Jun, Seoul (KR); Bai Sun Kong, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/714,878

(22) Filed: Mar. 1, 2010

(65) Prior Publication Data

US 2010/0271069 A1    Oct. 28, 2010

(30) Foreign Application Priority Data

Apr. 22, 2009    (KR) .................. 10-2009-0034870

(51) Int. Cl.
*H03K 19/0175* (2006.01)
(52) U.S. Cl. ................. 326/81; 326/68; 326/80
(58) Field of Classification Search ........... 327/108–112
See application file for complete search history.

(56) References Cited

U.S. PATENT DOCUMENTS

| 5,144,165 | A | * | 9/1992 | Dhong et al. | 326/80 |
| 5,880,602 | A | * | 3/1999 | Kaminaga et al. | 326/81 |
| 5,917,339 | A | | 6/1999 | Kim | |
| 6,084,431 | A | * | 7/2000 | Shigehara et al. | 326/81 |
| 6,838,908 | B2 | | 1/2005 | Ker et al. | |
| 2008/0157818 | A1 | | 7/2008 | Ker et al. | |

FOREIGN PATENT DOCUMENTS

KR    100223744    7/1999

* cited by examiner

*Primary Examiner* — Anh Q Tran
(74) *Attorney, Agent, or Firm* — F. Chau & Associates, LLC

(57) ABSTRACT

An input/output circuit includes an I/O node connected to a pull up and pull down circuit having a pull up and pull down transistors. Data is sent and received at through the I/O node. A level shifter provides voltages including a supply voltage and a high voltage higher than the supply voltage. A signal control circuit controls the voltage level applied to the pull up and pull down circuit. During a data input mode, data is received at the I/O node and the pull up transistor is biased at the high voltage to cut off the pull up transistor. During a data output mode, data is output at the I/O node and the pull down transistor pulls down the I/O node to ground when the output data is low, and the pull up transistor is activated when the output data is high.

27 Claims, 16 Drawing Sheets

LC2

LC3

INPUT/OUTPUT CIRCUIT AND INTEGRATED CIRCUIT APPARATUS INCLUDING THE SAME

CROSS-REFERENCE TO RELATED APPLICATION

This application claims under 35 U.S.C. §119 priority to and the benefit of Korean Patent Application No. 10-2009-0034870 filed on Apr. 22, 2009, in the Korean Intellectual Property Office, the entire content of which is incorporated by reference herein.

BACKGROUND

1. Technical Field

The present disclosure relates to an integrated circuit (IC) apparatus, and more particularly, to a mixed-voltage input/output (I/O) circuit for interfacing apparatuses having different operating voltages and an IC apparatus including the same.

2. Discussion of Related Art

In complementary metal-oxide semiconductor (CMOS) technology, a supply voltage is scaled down to reduce power consumption and the dimensions of a transistor are also scaled down to improve circuit performance and area efficiency. Some semiconductor chips in a microelectronic system are implemented using different CMOS techniques and cannot use the same voltage, and therefore, a mixed-voltage I/O interface is needed. For instance, a read voltage of a dynamic random access memory (DRAM) chip is 2.5 V for 80 nm DRAM half-pitch but is 2.0 V for 60 nm DRAM half-pitch.

When a conventional non-mixed interfacing method is used in a mixed-voltage system, generation of unwanted leakage current, decrease in the reliability of a gate oxide, and hot-carrier injection may occur.

In a receiving mode for receiving an external signal, the voltage of an I/O pad may be higher than a power supply voltage, and therefore, an unwanted leakage current path may be formed from the I/O pad to a power supply through a pull-up P-type metal-oxide semiconductor (PMOS) transistor. Methods for preventing the leakage current of a pull-up PMOS transistor have been studied. However, these conventional methods need additional pads or transistors connected in complicated ways. Moreover, some of the conventional methods increase I/O pad loading and pull-up gate loading, which may decrease I/O interface speed.

The reliability of a gate oxide is decreased since an excessively high electronic field is formed at the gate oxide. While a dual-oxide process can address the reliability problem, a transistor having a thick gate oxide may decrease I/O interface speed. To provide gate-oxide reliability in a pull-up transistor without decreasing the I/O interface speed, gate tracking has been introduced. To avoid reliability problems related with a pull-down transistor and a receiver, a method of connecting in series additional N-type metal-oxide semiconductor (NMOS) transistors whose gates are connected to a power supply is usually used. However, it becomes difficult to limit the swing level of a receiving signal in the additional NMOS transistors in a low power supply voltage environment or a low-voltage operating environment.

Hot-carrier injection occurs when there is a large voltage difference between a drain and a source. A stacked NMOS transistor and a blocking transistor, each of which is connected in series with a pull-down transistor, prevent hot-carrier injection to the pull-down transistor. However, these transistors may undergo hot-carrier injection when a receiving mode is converted into a transmission mode. Accordingly, to reduce an excessively high voltage or a high potential charge accumulated at an I/O pad in the receiving mode, a hot-carrier protection circuit is required.

To address the above-described concerns that may occur in a mixed interface system and to support a low operating voltage, new mixed-voltage interfacing is needed.

SUMMARY

Exemplary embodiments of the present inventive concept provide an input/output (I/O) circuit for transmitting input data even under high or low voltage operating conditions.

Exemplary embodiments of the present inventive concept also provide an I/O circuit for preventing or reducing leakage current under low voltage operating conditions.

Exemplary embodiments of the present inventive concept also provide an I/O circuit for reducing the decrease of reliability of a gate oxide of a transistor even under low voltage operating conditions.

Exemplary embodiments of the present inventive concept also provide an I/O circuit for preventing hot-carrier injection under low voltage operating conditions.

In accordance with an exemplary embodiment an input/output circuit includes an I/O node connected to a pull up and pull down circuit comprising a pull up transistor and a pull down transistor configured to receive a data input from an I/O pad and to send a data output to the I/O pad, a level shifter configured to provide various voltages including a supply voltage and a high voltage that is at a higher voltage than the supply voltage, and a signal control circuit configured to control a voltage level applied to the pull up and pull down circuit. During a data input mode, data is received at the I/O node from the I/O pad and the pull up transistor is biased at the high voltage to cut off the pull up transistor, and during a data output mode, data is output at the I/O node and the pull down transistor is activated to pull down the I/O node to ground when the output data is low, and the pull up transistor is activated when the output data is high.

During the data output mode the signal control circuit may be configured to apply the supply voltage at the substrate of the pull up transistor.

During the data output mode the signal control circuit may be configured to apply gate voltage to the pull up transistor that swings between the supply voltage and a low level to activate the pull up transistor when the output data voltage is high.

During the data input mode the signal control circuit may be configured to apply the high voltage to the substrate of the pull up transistor.

The signal control circuit may be configured to apply to the gate of the pull-down transistor an intermediate voltage that is equal to or greater than the supply voltage.

The signal control circuit may be configured to apply a delay when the data input mode is switched to the data output mode to delay a voltage swing at the I/O node from a high level to a low level.

In accordance with an exemplary embodiment of the an I/O circuit includes a transmitter that has at least one pull-up transistor connected between a first power supply and an I/O node and at least one pull-down transistor connected between the I/O node and a second voltage node to transmit output data to an external device through the I/O node, a receiver that receives input data through the I/O node, and a timing/level controller configured to selectively apply a voltage of the first power supply in a transmission mode to a bulk node of the at least one pull-up transistor, and that controls the bulk node to have a voltage higher than the voltage of the first power supply.

The at least one pull-down transistor may include a first pull-down transistor and a second pull-down transistor connected in series, the second pull-down transistor being connected to the second voltage node.

The at least one pull-up transistor may include a first pull-up transistor and a second pull-up transistor connected in series, the second pull-up transistor being coupled to the I/O node.

The timing/level controller may be configured to apply a delay when the data input mode is switched to the data output mode to delay a voltage swing at the I/O node from a high level to a low level.

The I/O circuit may further include a transistor coupled between the bulk node and a gate of the at least one pull-up transistor, and a diode coupled between a gate of the transistor and a second voltage node. The diode may be configured to prevent a voltage difference between the gate and the source of the transistor from increasing and a gate voltage of the transistor from being higher than the voltage of the first power supply.

The at least one pull-down transistor may include a first pull-up transistor and a second pull-up transistor connected in series, and the transistor may be coupled between the bulk node and the gate of the first pull-up transistor.

A receiving switch transistor may be connected between the I/O node and the receiver, the receiving switch transistor being configured to control a voltage swing at the receiver.

The timing/level controller may further include a pull-up switch transistor connected to the gate of the first pull-up transistor and the gate of the second pull-up transistor.

The timing/level controller may further include a first level shifter that converts a level of a signal obtained by performing a logic operation on an output enable signal and a delayed output enable signal resulting from delaying the output enable signal and that outputs a level-shifted signal to the bulk node.

The at least one pull-down transistor may include a first pull-down transistor and a second pull-down transistor connected in series, and the I/O circuit may further include a pre-driver that generates a pull-up signal and a pull-down signal based upon a delayed output enable signal and the output data and that outputs the pull-up signal and the pull-down signal to a pull-up node corresponding to a gate of the at least one pull-up transistor and a pull-down node corresponding to a gate of the second pull-down transistor, respectively.

The first level shifter may be configured to convert a voltage level of the second voltage node into the voltage level of the first power supply, and a voltage level of the first power supply into a voltage level of a high voltage, and the high voltage may be higher than a voltage of the first power supply.

The second voltage node may be at a ground voltage.

The I/O circuit may further include a receiving switch transistor connected between the I/O node and the receiver, the receiving switch transistor configured to control a voltage swing at the receiver.

The I/O circuit may further include a transmission controller connected between the pre-driver and the at least one pull-up transistor and the at least one pull-down transistor to control output data transmission to the external device through the I/O node.

The transmission controller may include a pull-up switch coupled between the at least one pull-up transistor and the pre-driver.

The timing/level controller may include a switch control level shifter configured to control the pull-up switch for transmitting the output data to the external device through the I/O node.

The shift control level shifter may be configured to convert a voltage level of the first power supply into an intermediate voltage level greater than the first power supply and to convert a voltage level of the second voltage node into a voltage level of the first power supply.

The pull-up switch may be a transmission gate.

The timing/level controller may include a transmission gate level shifter configured to control the transmission gate for transmitting the output data to the external device through the I/O node.

The transmission gate level shifter may be configured to convert a voltage level of the second voltage node into the voltage level of the first power supply, and a voltage level of the first power supply into a voltage level of a high voltage, and the high voltage may be higher than a voltage of the first power supply.

In accordance with an exemplary embodiment a memory system includes a memory controller having a memory interface, and a memory device having a memory and an input/output circuit that communicates with the memory interface. The input/output circuit includes a transmitter that comprises at least one pull-up transistor connected between a first power supply and an I/O node and at least one pull-down transistor connected between the I/O node and a second voltage node to transmit output data to the memory interface through the I/O node, a receiver that receives input data from the memory interface through the I/O node, and a timing/level controller configured to selectively apply a voltage of the first power supply in a transmission mode to a bulk node of the at least one pull-up transistor, and that controls the bulk node to have a voltage higher than the voltage of the first power supply.

The output data may be transmitted to and the input data may be received from a chip controller in the memory device.

In accordance with an exemplary embodiment computing system includes a central processing unit and a memory system communicable with the central processing unit over a system bus. The memory system includes a memory controller having a memory interface and a memory device having a memory and an input/output circuit that communicates with the memory interface. The input/output circuit includes a transmitter that comprises at least one pull-up transistor connected between a first power supply and an I/O node and at least one pull-down transistor connected between the I/O node and a second voltage node to transmit output data to the system bus through the I/O node, a receiver that receives input data from the system bus through the I/O node, and a timing/level controller configured to selectively apply a voltage of the first power supply in a transmission mode to a bulk node of the at least one pull-up transistor, and that controls the bulk node to have a voltage higher than the voltage of the first power supply.

In accordance with an exemplary embodiment a method of operating an I/O buffer having an I/O pad, includes, in a transmission mode for transmitting output data to an external device, selectively turning on: a pull-up transistor coupled to the I/O pad in response to first output data having a logic high signal, or a pull-down transistor coupled to the I/O pad in response to second output data having a logic low signal, driving the I/O pad at the voltage of a first power supply voltage for the first output data transmission, driving the I/O pad at a voltage of a second voltage node for the second output data transmission, and selectively applying one of the first power supply voltage or a voltage higher than the voltage of the first power supply to a bulk node of the pull-up transistor.

The method may further include, in a receiving mode for receiving input data from an external device, turning off the pull-up transistor and the pull-down transistor of the transmitter, and providing to a receiver input data received through the I/O pad.

In accordance with an exemplary embodiment a method of hot-carrier injection prevention at an I/O pad of an I/O buffer when an external high-voltage signal is received in a receiving mode and a signal at a logic low level is output to an external device in a transmission mode after a mode transition from the receiving mode to the transmission mode, includes, when the receiving mode is converted into the transmission mode, lowering a voltage at the I/O pad through a pull-up transistor during a delay time from the activation of an output enable signal until the formation of a pull-down path through a pull-down transistor for logic low level output signal transmission.

BRIEF DESCRIPTION OF THE DRAWINGS

The above and other features and advantages of the present inventive concept will become more apparent by describing in detail exemplary embodiments with reference to the attached drawings in which:

FIG. 4 is a circuit diagram of a further modification of the I/O circuit illustrated in

FIG. 1;

DETAILED DESCRIPTION OF THE EMBODIMENTS

Figure 1:
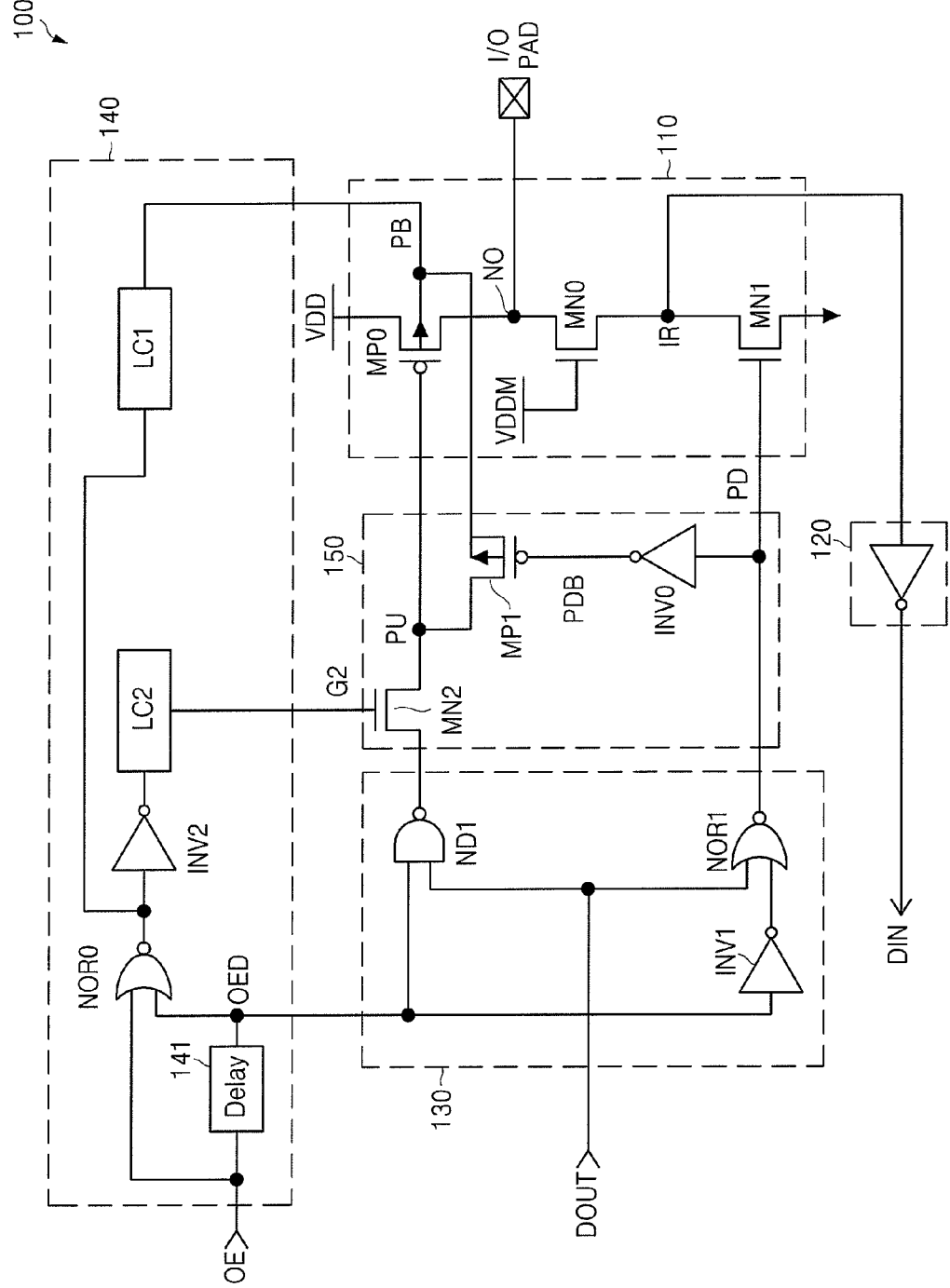
FIG. 1 is a circuit diagram of an input/output (I/O) circuit according to an exemplary embodiment of the present inventive concept.

The present inventive concept will be described more fully hereinafter with reference to the accompanying drawings, in which exemplary embodiments are shown. The present inventive concept may, however, be embodied in many different forms and should not be construed as limited to the exemplary embodiments set forth herein. In the drawings, like numbers refer to like elements throughout.

It will be understood that when an element is referred to as being "connected" or "coupled" to another element, it can be directly connected or coupled to the other element or intervening elements may be present.

It will be also understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

FIG. 1 is a circuit diagram of an input/output (I/O) circuit 100 according to an exemplary embodiment of the present inventive concept. The I/O circuit 100 includes a transmitter 110, a receiver 120, a pre-driver 130, a timing/level controller 140, and a transmission controller 150.

The transmitter 110 is a circuit for transmitting output data DOUT through an I/O node NO and an I/O pad to an external device and includes a pull-up transistor MP0, a first pull-down transistor MN0, and a second pull-down transistor MN1. The pull-up transistor MP0 is connected between a first power supply VDD and the I/O node NO. A gate, i.e., a pull-up node PU of the pull-up transistor MP0 is connected with an output of the pre-driver 130 through a pull-up switch transistor MN2. The first and second pull-down transistors MN0 and MN1 are connected in series between the I/O node NO and a second voltage node GND. A gate of the first pull-down transistor MN0 is connected to an intermediate voltage VDDM and a gate, i.e., a pull-down node PD of the second pull-down transistor MN1 is connected with another output of the pre-driver 130.

The receiver 120 is connected with a receiver input node IR and receives data input through the I/O pad and the I/O node NO. The receiver input node IR is connected between the first pull-down transistor MN0 and the second pull-down transistor MN1.

The pre-driver 130 generates and outputs a pull-up signal (hereinafter, referred to as first output data) and a pull-down signal (hereinafter, referred to as second output data) to the pull-up node PU and the pull-down node PD, respectively, based upon a delayed output enable signal OED and the output data DOUT. In a transmission mode for outputting the output data DOUT, the first output data and the second output data have the same logic level so that only one between the pull-up transistor MP0 and the second pull-down transistor MN1 is turned on. In a receiving mode for receiving input data, the first and second output data have logic levels enabling both of the pull-up transistor MP0 and the second pull-down transistor MN1 to be turned off.

The pre-driver 130 includes a NAND gate ND1, a NOR gate NOR1, and an inverter INV1. The NAND gate ND1 performs a NAND operation on the output data DOUT and the delayed output enable signal OED to output the first output data. The NOR gate NOR1 performs a NOR operation on an inverted signal of the delayed output enable signal OED and the output data DOUT to output the second output data.

The timing/level controller 140 includes a delay unit 141, a NOR gate NOR0, a first level shifter LC1, a second level shifter LC2, and an inverter INV2. When the receiving mode is converted into the transmission mode, the timing/level controller 140 controls a bulk node PB (or a substrate) of the pull-up transistor MP0 to have the voltage of the first power supply VDD for a predetermined period of time (e.g., a delay time of the delay unit 141) so that a high potential charge accumulated at the I/O node NO in the receiving mode is transmitted to the first power supply VDD and then the output data DOUT is transmitted to an external device through the I/O node NO. This operation will be described in more detail herein below.

The delay unit 141 delays an output enable signal OE by a predetermined delay time, e.g., a first delay time, and outputs the delayed output enable signal OED. The NOR gate NOR0 performs a NOR operation on the output enable signal OE and the delayed output enable signal OED and outputs a signal having a pulse width greater than a pulse width of the input signals OE and OED. The output signal of the NOR gate NOR0 is input to the first level shifter LC1 and is input to the second level shifter LC2 through the inverter INV2. The delayed output enable signal OED is also input to the pre-driver 130.

Figure 12A:
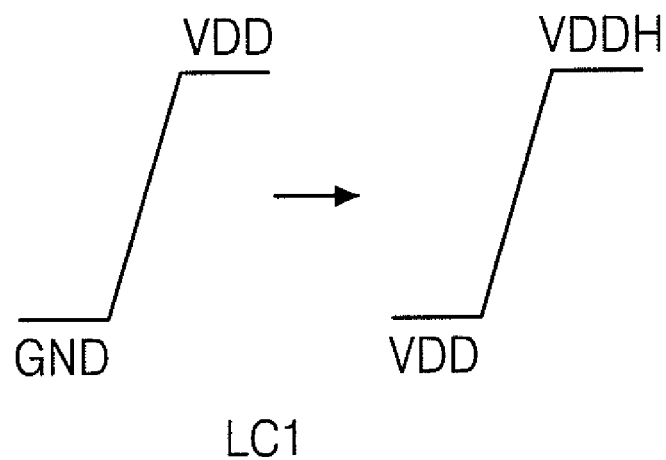
FIGS. 12A, 12B and 12C are schematic diagrams illustrating levels of I/O signals in first, second and third level shifters, respectively.
Figure 12B:
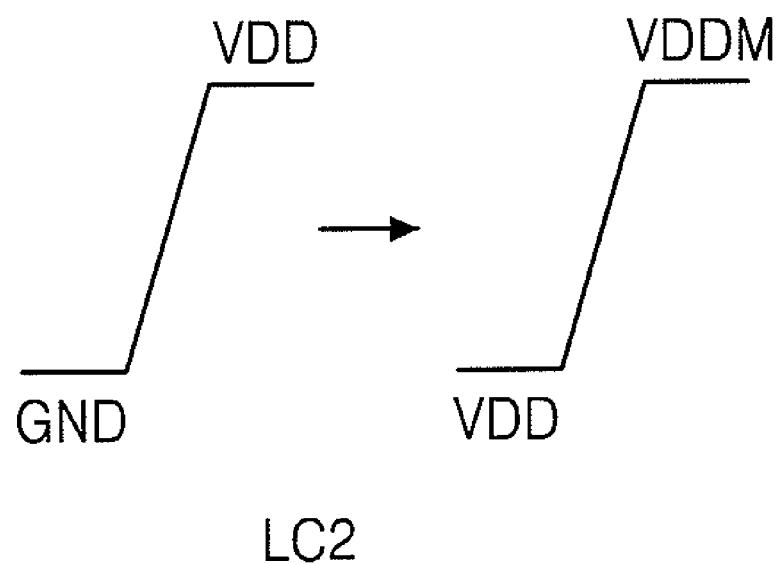

The second level shifter LC2 converts, as is illustrated in FIG. 12B, the voltage level of the second voltage node GND (hereinafter, referred to as a ground level) and the voltage level of the first power supply VDD to the voltage level of the first power supply VDD and to the voltage level of the intermediate voltage VDDM, respectively. The voltage level of the intermediate voltage VDDM is equal to or higher than the voltage level of the first power supply VDD. For instance, the intermediate voltage VDDM may be "the voltage of the first power supply VDD+the threshold voltage Vthn of an NMOS transistor", i.e., "VDD+Vthn".

The first level shifter LC1 converts, as is illustrated in FIG. 12A, the ground level and the voltage level of the first power supply VDD to the voltage level of the first power supply VDD and to a level of a high voltage VDDH, respectively. The high voltage VDDH is higher than the voltage of the first power supply VDD. For instance, the high voltage VDDH may be double the voltage of the first power supply VDD or similar to a high voltage of an external device interfaced by the I/O circuit 100.

The intermediate voltage VDDM and the high voltage VDDH, which are higher than the voltage of the first power supply VDD, may be generated by an internal voltage generator (not shown). The internal voltage generator may include a charge pump. The high voltage VDDH is used to pull up the bulk node PB and the pull-up node PU in the receiving mode, thereby preventing an unwanted current path from being formed from the I/O node NO to the bulk node PB through the pull-up transistor MP0. The intermediate voltage VDDM is used to pull up the gates of the first pull-down transistor MN0 and the pull-up switch transistor MN2, thereby increasing the swing level of the receiver input node IR. Accordingly, the voltage of receiving data DIN can be reliably secured even in a low voltage operating environment, and therefore, the occurrence of errors in the receiving data DIN can be reduced. In other words, the intermediate voltage VDDM is used to control the gates of the first pull-down transistor MN0 and the pull-up switch transistor MN2 to increase the limited swing level.

The transmission controller 150 includes an inverter INV0 connected with the pull-down node PD, a PMOS transistor MP1, and the pull-up switch transistor MN2. The pull-up node PU is connected with the bulk node PB through the PMOS transistor MP1. A gate of the PMOS transistor MP1 is connected to an output of the inverter INV0 and operates in response to an inverted signal PDB of a pull-down signal.

A gate, i.e., a node G2 of the pull-up switch transistor MN2 is controlled by a second level-shifted output enable signal obtained by level-shifting the output signal of the inverter INV2 using the second level shifter LC2. As described above, the second level shifter LC2 is for controlling the pull-up switch transistor MN2 and thus referred to as a switch control level shifter.

The pull-up transistor MP0 and the substrate, i.e., the bulk node PB of the PMOS transistor MP1 are controlled by a first level-shifted output enable signal obtained by level-shifting the output signal of the NOR gate NOR0 using the first level shifter LC1. As described above, the first level shifter LC1 is for controlling the bulk node PB and thus referred to as a bulk node level shifter.

The PMOS transistor MP1 is controlled by the output signal PDB of the inverter INV0 so that the pull-up node PU swings fully from the voltage of the second voltage node GND to the voltage of the first power supply VDD in the transmission mode and is maintained at the voltage level of the high voltage VDDH in the receiving mode. In the receiving mode, the second output data at a logic low level is applied to the pull-down node PD. As a result, the signal PDB is at a logic high level (or the voltage level of the first power supply VDD). At this time, the bulk node PB has the high voltage VDDH, and therefore, the PMOS transistor MP1 is turned on and the pull-up node PU is also maintained at the high voltage VDDH. Consequently, a leakage current path is prevented from being formed in the receiving mode. In the transmission mode, the PMOS transistor MP1 is turned on only when the pull-down node PD is at the logic high level, enabling the pull-up node PU to have the voltage of the first power supply VDD.

Meanwhile, the gate of the PMOS transistor MP1 may be connected to the first power supply VDD. In this case, the PMOS transistor MP1 is turned on to maintain the pull-up node PU at the high voltage VDDH in the receiving mode but is turned off in the transmission mode.

In a multi-I/O system having a plurality of I/O pads, the timing/level controller 140 may be used in common for all of the I/O pads. As a result, a necessary area is reduced. The operation of the I/O circuit 100 will be described below.

In the transmission mode for transmitting the output data DOUT to an external device, the pull-up node PU and the pull-down node PD are both at a logic high level or a logic low level so that the output data DOUT is transmitted to the I/O pad. When both of the pull-up node PU and the pull-down node PD are at the logic high level, the I/O pad is driven at the voltage of the second voltage node GND. When both of the pull-up node PU and the pull-down node PD are at the low logic level, the I/O pad is driven at the voltage of the first power supply VDD.

In the transmission mode, the output enable signal OE is activated to a logic high level. Accordingly, the output of the second level shifter LC2 has the voltage level of the intermediate voltage VDDM, the output of the first level shifter LC1 has the voltage level of the first power supply VDD, and the bulk node PB has the voltage level of the first power supply VDD. In addition, the gate G2 of the pull-up switch transistor MN2 has the intermediate voltage VDDM and the pull-up switch transistor MN2 is turned on, thereby transmitting the first output data of the pre-driver 130 to the pull-up node PU without distortion. In other words, since a voltage higher than the voltage of the first power supply VDD is applied to the gate G2 of the pull-up switch transistor MN2, the first output data of the pre-driver 130 is transmitted to the pull-up node PU even when the first output data is a logic high signal.

The second output data of the pre-driver 130 is transmitted to the pull-down node PD. Accordingly, in the transmission mode, the pull-up transistor MP0 and the second pull-down transistor MN1 are selectively turned on in response to the first output data and the second output data, thereby driving the I/O node NO at the voltage of the first power supply VDD (or supplying current to an external device through the I/O node NO) or driving the I/O node NO at the voltage of the second voltage node GND (or sinking current from the I/O node NO to the ground.

Meanwhile, in the receiving mode for receiving input data from an external device, the pull-up transistor MP0 and the second pull-down transistor MN1 of the transmitter 110 are turned off to transmit the input data received through the I/O pad to the receiver 120. The gate G2 of the pull-up switch transistor MN2 has the intermediate voltage VDDM, and therefore, the receiver input node IR swings between the voltage of the first power supply VDD and the voltage of the second voltage node GND. Accordingly, the swing level has increased as compared to conventional technology in which the receiver input node IR swings between a voltage obtained by subtracting the threshold voltage Vthn of an NMOS transistor from the voltage of the first power supply VDD, i.e., "VDD−Vthn" and the voltage of the second voltage node GND.

In the receiving mode, the output enable signal OE is deactivated to a logic low level. Accordingly, the output of the second level shifter LC2 has the voltage level of the first power supply VDD and the output of the first level shifter LC1 has the voltage level of the high voltage VDDH. As a result, the bulk node PB and the pull-up node PU have the high voltage VDDH. Consequently, leakage current that may occur from the I/O node NO to the pull-up transistor MP0 is prevented. When a signal received from an external device has a high voltage, a voltage at the I/O node NO may be higher than the voltage of the first power supply VDD, for example, similar to the high voltage VDDH. Even in this case, since the bulk node PB has the high voltage VDDH, a junction leakage current path that may be formed from the I/O node NO to the substrate of the pull-up transistor MP0 can be interrupted. In addition, since the pull-up node PU also has the high voltage VDDH, the pull-up transistor MP0 is not turned on, and therefore, a leakage current path through the pull-up transistor MP0 can be prevented.

The gate G2 of the pull-up switch transistor MN2 has the voltage of the first power supply VDD due to the second level shifter LC2 and a source of the pull-up switch transistor MN2, i.e., the first output data of the pre-driver 130 also has the voltage of the first power supply VDD, and therefore, the pull-up switch transistor MN2 remains in an off-state.

Hot-carrier injection can be prevented using a timing control method using a time difference between an output enable signal with an extended pulse width and the delayed output enable signal OED. This will be described in more detail below.

Hot-carrier injection becomes problematic especially when an external high-voltage signal is received in the receiving mode and then a signal at a logic low level is output to an external device, that is, the I/O node NO is driven at the voltage of the second voltage node GND in the transmission mode after mode transition. When the high-voltage signal is received, a large amount of high-potential charge exists at the I/O pad. If a pull-down path is formed in this state, a large voltage difference occurs between drain and source of the first pull-down transistor MN0, causing the hot-carrier injection.

According to an exemplary embodiment of the present inventive concept, the gate G2 of the pull-up switch transistor MN2 and the bulk node PB become to have the intermediate voltage VDDM and the voltage of the first power supply VDD, respectively, before a pull-down path is formed. Accordingly, the large amount of high-potential charge at the I/O pad is transmitted to the bulk node PB or the first power supply VDD through the pull-up transistor MP0 and a large amount of high-potential charge at the pull-up node PU is transmitted to the first power supply VDD through the pull-up switch transistor MN2 and the PMOS transistor MP1. When the receiving mode is converted into the transmission mode, a voltage at the I/O pad is lowered through the pull-up transistor MP0 during a delay time from the activation of the output enable signal OE until the formation of the pull-down path, so that hot-carrier injection can be prevented from occurring at the first pull-down transistor MN0 even if the pull-down path is formed. In other words, when the data input mode is switched to the data output mode, a voltage swing at the I/O node from a high level to a low level is delayed.

Gate-oxide reliability problem can be solved using the intermediate voltage VDDM that can be varied. In more detail, the intermediate voltage VDDM can be changed according to the voltage level of the first power supply VDD. For instance, when the voltage level of the first power supply VDD is relatively high, for example, is higher than a predetermined level, the intermediate voltage VDDM is set to be similar to the voltage of the first power supply VDD. When the voltage level of the first power supply VDD is relatively low, for example, is lower than a predetermined level, that is, under low voltage operating conditions, the intermediate voltage VDDM is set to be equal to or higher (e.g., VDD+Vthn) than the voltage of the first power supply VDD.

As described above, according to an exemplary embodiment of the present inventive concept, the substrate, i.e., the bulk node PB of the pull-up transistor MP0 has the high voltage VDDH, thereby preventing a leakage current path. In addition, the intermediate voltage VDDM is changed according to an operating voltage (i.e., the voltage of the first power supply VDD) to increase the swing level of the receiver input node IR under the low voltage operating conditions, thereby reducing the occurrence of errors in receiving data. Also, at the transition from the receiving mode to the transmission mode, a high-potential charge remaining at the I/O pad is discharged using the timing control method before output data is transmitted to an external device, thereby preventing hot-carrier injection.

Figure 2:
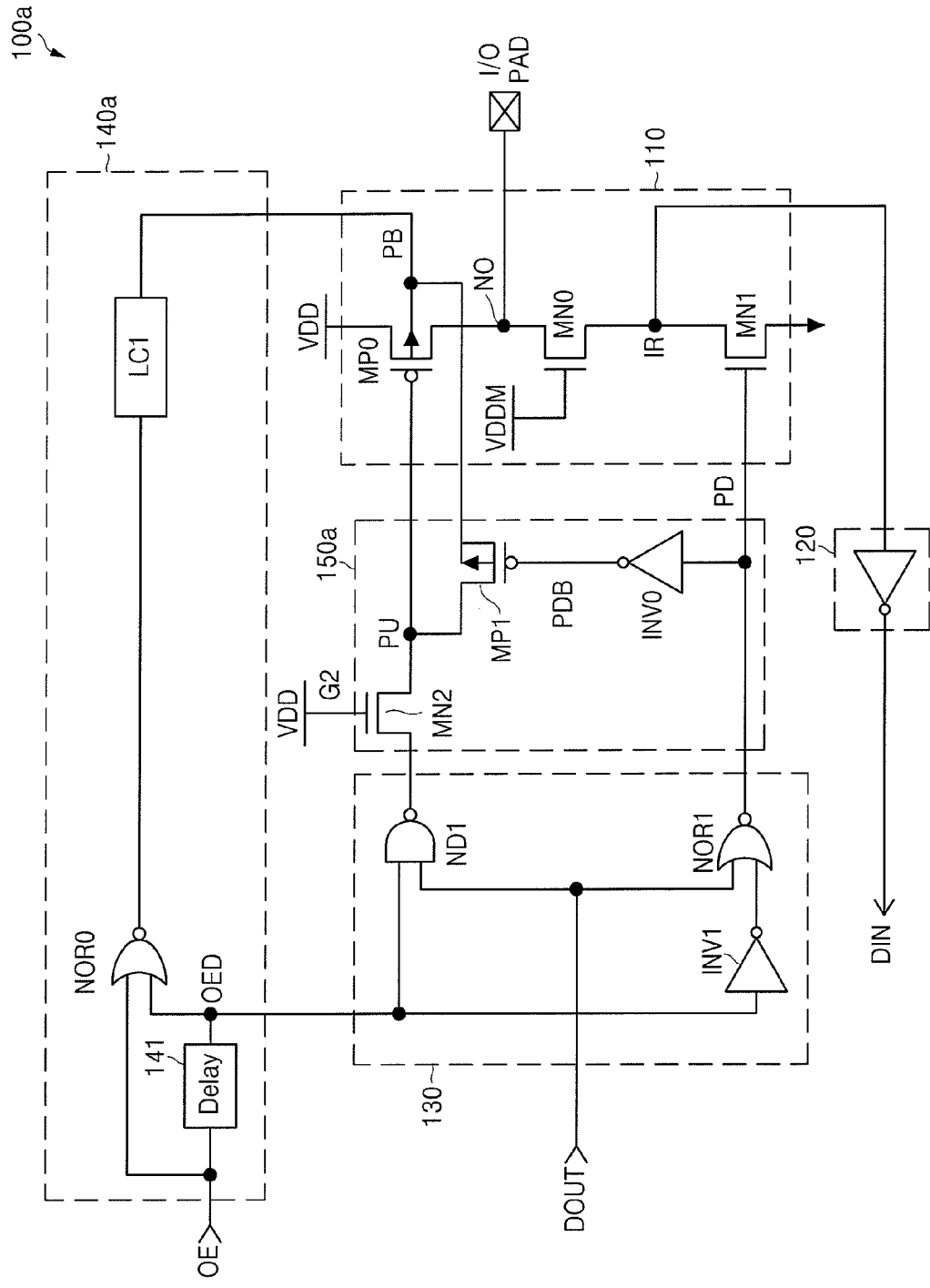
FIG. 2 is a circuit diagram of a modification of the I/O circuit illustrated in FIG. 1.

FIG. 2 is a circuit diagram of a modification 100a of the I/O circuit 100 illustrated in FIG. 1. Referring to FIG. 2, the I/O circuit 100a includes the transmitter 110, the receiver 120, the pre-driver 130, a timing/level controller 140a, and a transmission controller 150a. The transmitter 110, the receiver 120, and the pre-driver 130 included in the I/O circuit 100a are the same as those included in the I/O circuit 100, but the timing/level controller 140a and the transmission controller 150a included in the I/O circuit 100a are different from the corresponding elements 140, 150 included in the I/O circuit 100. Accordingly, the difference between the I/O circuit 100 and the I/O circuit 100a will be mainly described.

The gate G2 of the pull-up switch transistor MN2 is connected to the output of the second level shifter LC2 in the I/O circuit 100 illustrated in FIG. 1, but it is connected to the first power supply VDD in the I/O circuit 100a illustrated in FIG. 2. Accordingly, while the intermediate voltage VDDM is applied to the gate G2 of the pull-up switch transistor MN2 in the I/O circuit 100 illustrated in FIG. 1 in the transmission mode, a voltage at the gate G2 of the pull-up switch transistor MN2 is fixed to the voltage of the first power supply VDD in the I/O circuit 100a illustrated in FIG. 2 in the transmission mode. While the output, i.e., the intermediate voltage VDDM of the second level shifter LC2 is connected to the gate G2 of the pull-up switch transistor MN2 to achieve a full swing operation at the pull-up node PU in FIG. 1, the inverter INV0 and the PMOS transistor MP1 enable the full-swing operation to be achieved at the pull-up node PU in FIG. 2 although the voltage at the gate G2 of the pull-up switch transistor MN2 is fixed to the voltage of the first power supply VDD.

Figure 3:
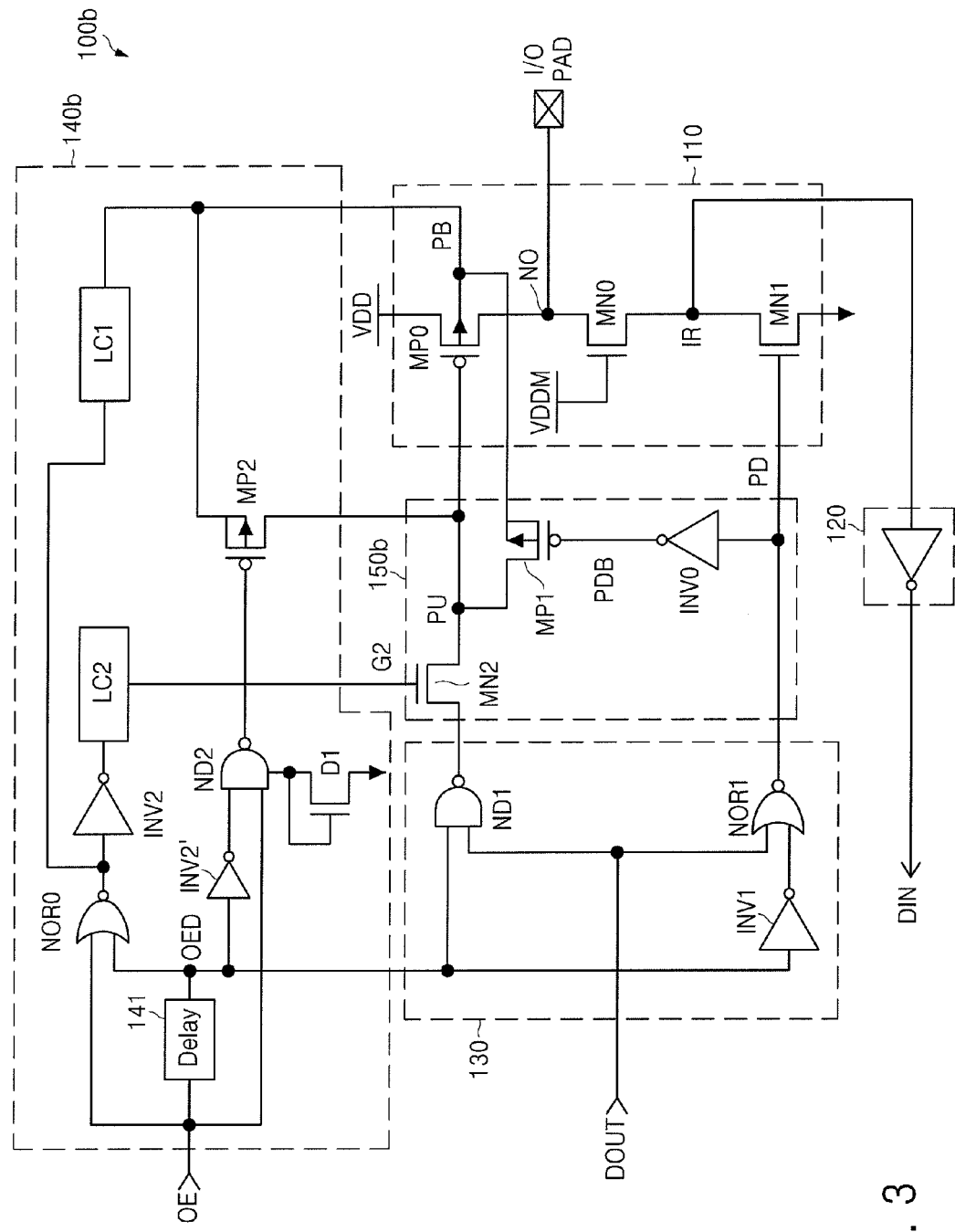
FIG. 3 is a circuit diagram of another modification of the I/O circuit illustrated in FIG. 1.

FIG. 3 is a circuit diagram of another modification 100b of the I/O circuit 100 illustrated in FIG. 1. Referring to FIG. 3, the I/O circuit 100a includes the transmitter 110, the receiver 120, the pre-driver 130, a timing/level controller 140b, and a transmission controller 150b. The transmitter 110, the receiver 120, and the pre-driver 130 included in the I/O circuit 100b are the same as those included in the I/O circuit 100, but the timing/level controller 140b and the transmission controller 150b included in the I/O circuit 100b are different from the corresponding elements 140, 150 included in the I/O circuit 100. Accordingly, the difference between the I/O circuit 100 and the I/O circuit 100b will be mainly described.

Compared to the timing/level controller 140, the timing/level controller 140b further include an inverter INV2', a NAND gate ND2, a PMOS transistor MP2, and a diode D1. The diode D1 prevents a voltage difference between gate and source of the PMOS transistor MP2 from increasing, thereby preventing a gate voltage of the PMOS transistor MP2 from being higher than the voltage of the first power supply VDD.

The inverter INV2' inverts the delayed output enable signal OED. The NAND gate ND2 performs a NAND operation on an output signal of the inverter INV2' and the output enable signal OE and outputs a result signal to the gate of the PMOS transistor MP2.

One node (i.e., the source or the drain) of the PMOS transistor MP2 and a bulk (or a substrate) thereof are connected in common to the output of the first level shifter LC1. The other node (i.e., the drain or the source) of the PMOS transistor MP2 is connected with the pull-up node PU. Accordingly, at the transition from the receiving mode to the transmission node, a high-potential charge at the pull-up node PU is transmitted to the bulk node PB through the PMOS transistor MP2, so that the pull-up node PU has the voltage of the first power supply VDD.

Figure 4:
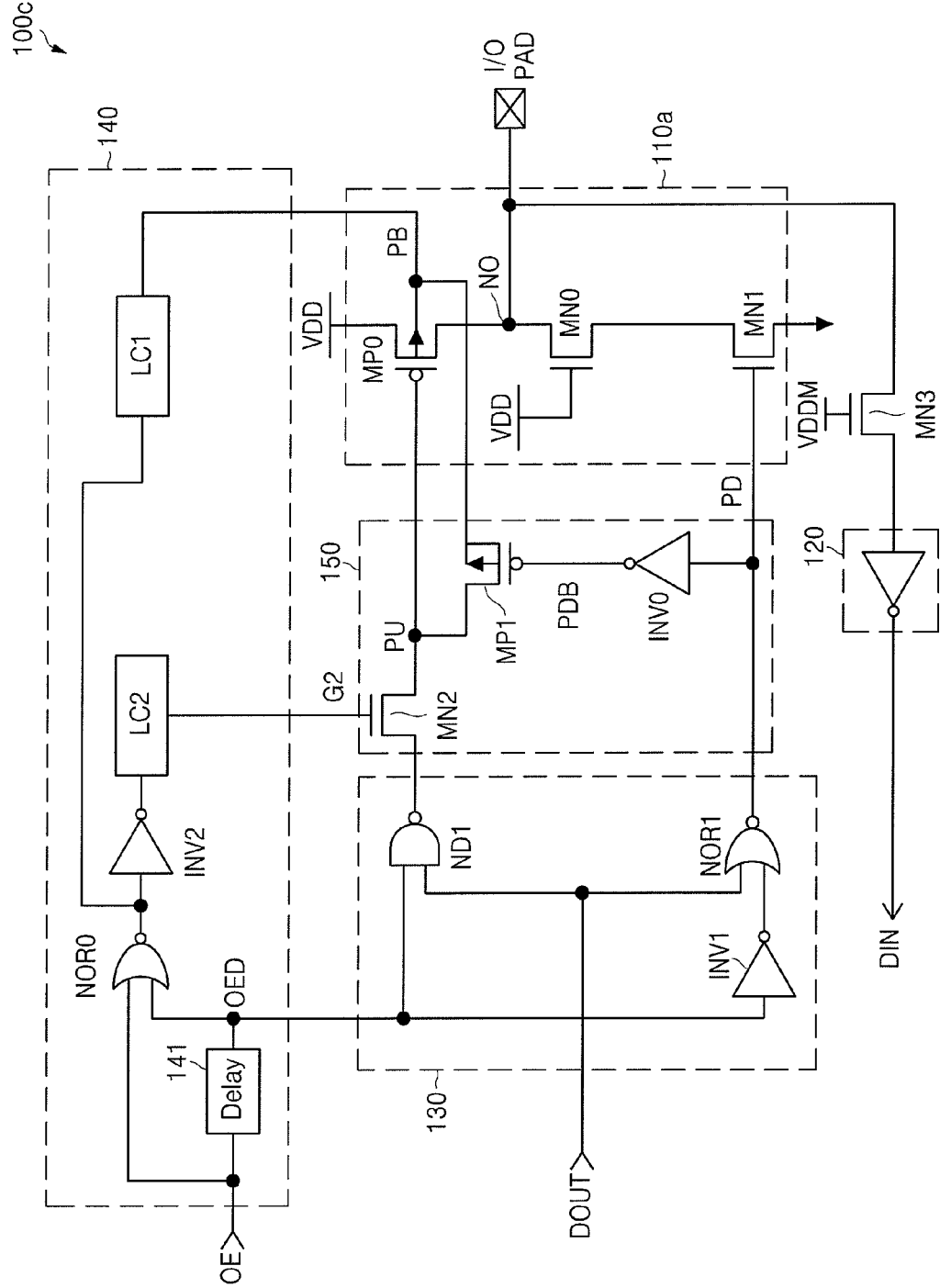

FIG. 4 is a circuit diagram of a further modification 100c of the I/O circuit 100 illustrated in FIG. 1. Referring to FIG. 4, the I/O circuit 100c includes a transmitter 110a, the receiver 120, a receiving switch transistor MN3, the pre-driver 130, the timing/level controller 140, and the transmission controller 150. The receiver 120, the pre-driver 130, the timing/level controller 140, and the transmission controller 150 included in the I/O circuit 100c are the same as those included in the I/O circuit 100, but the transmitter 110a included in the I/O circuit 100c is different from the transmitter 110 included in the I/O circuit 100 and the I/O circuit 100c further includes the receiving switch transistor MN3 as compared to the I/O circuit 100. Accordingly, the difference between the I/O circuit 100 and the I/O circuit 100c will be mainly described.

The receiving switch transistor MN3 is connected between the I/O node NO and the receiver 120 and has a gate controlled by the intermediate voltage VDDM. Since the gate of the receiving switch transistor MN3 has the intermediate voltage VDDM, the receiver input voltage swings between the voltage of the first power supply VDD and the voltage of the second voltage node GND. Meanwhile, the first pull-down transistor MN0 included in the I/O circuit 100c illustrated in FIG. 4 is not used in the receiving mode, and therefore, the voltage of the first power supply VDD instead of the intermediate voltage VDDM is applied to the gate of the first pull-down transistor MN0.

Figure 5:
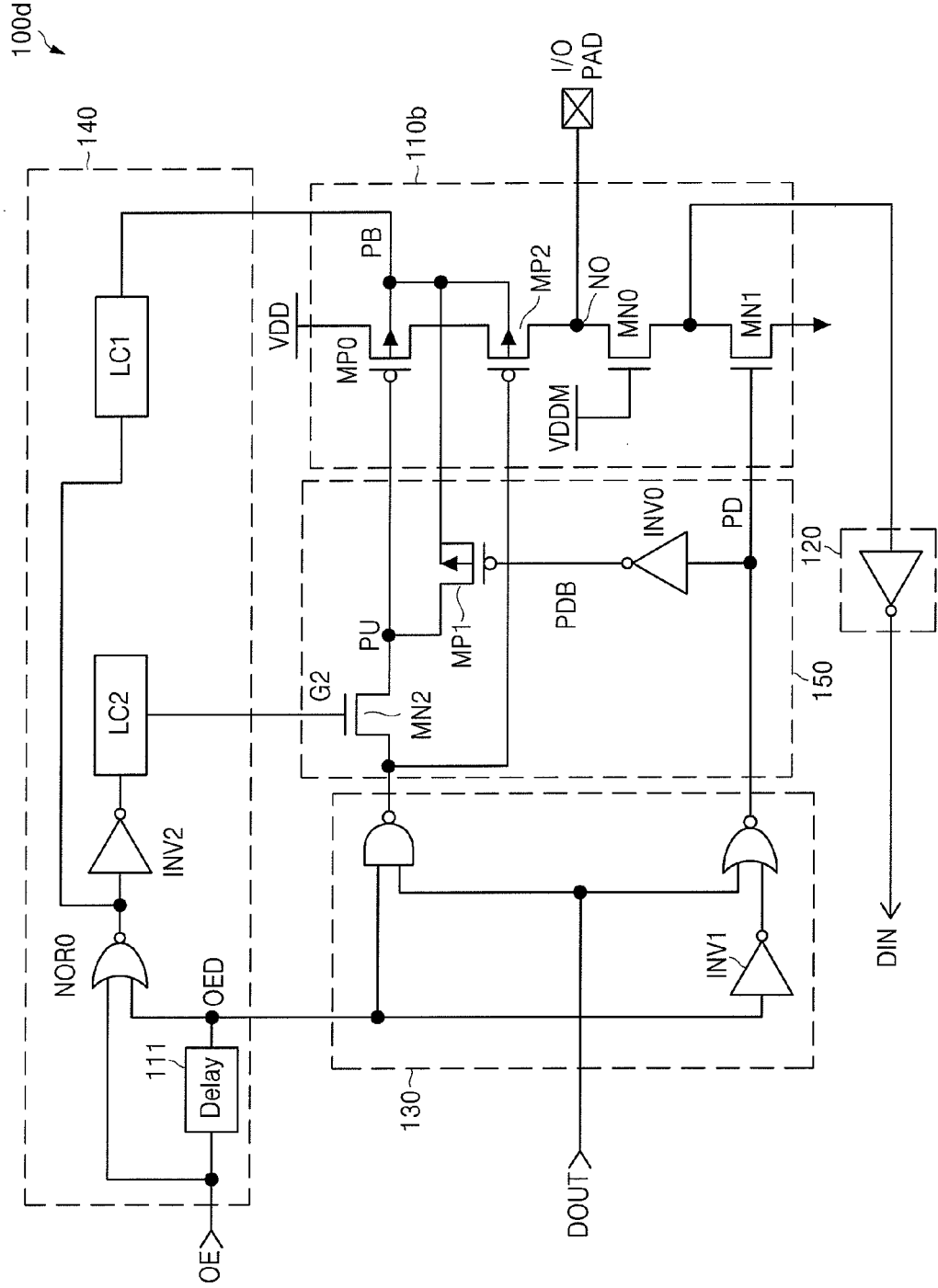
FIG. 5 is a circuit diagram of another modification of the I/O circuit illustrated in FIG. 1.

FIG. 5 is a circuit diagram of another modification 100d of the I/O circuit 100 illustrated in FIG. 1. Referring to FIG. 5, the I/O circuit 100d includes a transmitter 110b, the receiver 120, the pre-driver 130, the timing/level controller 140, and the transmission controller 150. The receiver 120, the pre-driver 130, the timing/level controller 140, and the transmission controller 150 included in the I/O circuit 100d are the same as those included in the I/O circuit 100, but the transmitter 110b included in the I/O circuit 100d is different from the transmitter 110 included in the I/O circuit 100.

The transmitter 110b includes the first pull-up transistor MP0 and a second pull-up transistor MP2 which are connected in series between the first power supply VDD and the I/O node NO. In other words, the transmitter 110b has a structure in which pull-up transistors are stacked. The second pull-up transistor MP2 is connected between the first pull-up transistor MP0 and the I/O node NO. A gate of the second pull-up transistor MP2 is connected with one output node of the pre-driver 130 and a bulk (or a substrate) thereof is connected with the bulk node PB of the first pull-up transistor MP0.

When data at a logic low level of 0 V is input to the I/O node NO included in the I/O circuit 100 illustrated in FIG. 1 in the receiving mode, a difference between a gate voltage of the pull-up transistor MP0 and a voltage at the I/O node NO is similar to the voltage level of the high voltage VDDH. In the I/O circuit 100d illustrated in FIG. 5 in which the second pull-up transistor MP2 is interposed between the first pull-up transistor MP0 and the I/O node NO, however, a difference between a gate voltage of the second pull-up transistor MP2 and the voltage at the I/O node NO is similar to the voltage level of the first power supply VDD less than the voltage level of the high voltage VDDH.

As described above, the I/O circuit 100 according to an exemplary embodiment of the present inventive concept can be modified in various ways. Although not shown, other modifications can be produced by combining the modifications illustrated in FIGS. 2 through 5.

Figure 6:
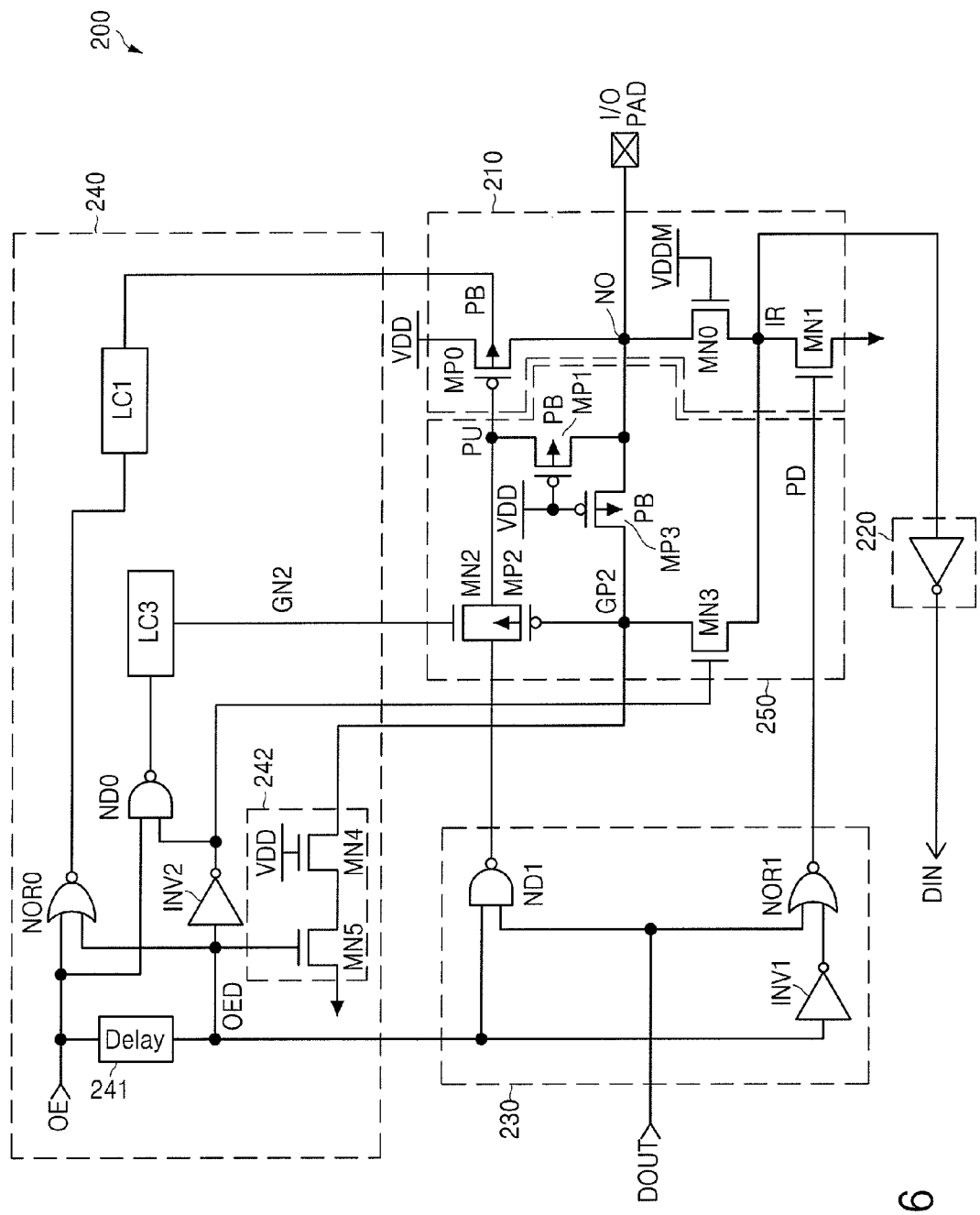
FIG. 6 is a circuit diagram of an I/O circuit according to an exemplary embodiment of the present inventive concept.

FIG. 6 is a circuit diagram of an I/O circuit 200 according to an exemplary embodiment of the present inventive concept. The I/O circuit 200 includes a transmitter 210, a receiver 220, a pre-driver 230, a timing/level controller 240, and a transmission controller 250. The transmitter 210, the pre-driver 230, and the receiver 220 are the same as the transmitter 110, the pre-driver 130, and the receiver 120 illustrated in FIG. 1. Thus, descriptions thereof will be omitted.

The timing/level controller 240 includes a delay unit 241, a NOR gate NOR0, an inverter INV2, a NAND gate ND0, a first level shifter LC1, and a third level shifter LC3. The delay unit 241 delays the output enable signal OE by a predetermined delay time (e.g., the first delay time) and outputs the delayed output enable signal OED. The NOR gate NOR0 performs a NOR operation on the output enable signal OE and the delayed output enable signal OED and provides a result signal as an input to the first level shifter LC1. Accordingly, the output signal of the NOR gate NOR0 is an inverted signal of an output enable signal having an extended pulse width. The delayed output enable signal OED is also input to the pre-driver 230.

The inverter INV2 inverts the delayed output enable signal OED. The NAND gate ND0 performs a NAND operation on the output enable signal OE and an output signal of the inverter INV2 and provides a result signal as an input to the third level shifter LC3.

Figure 12C:
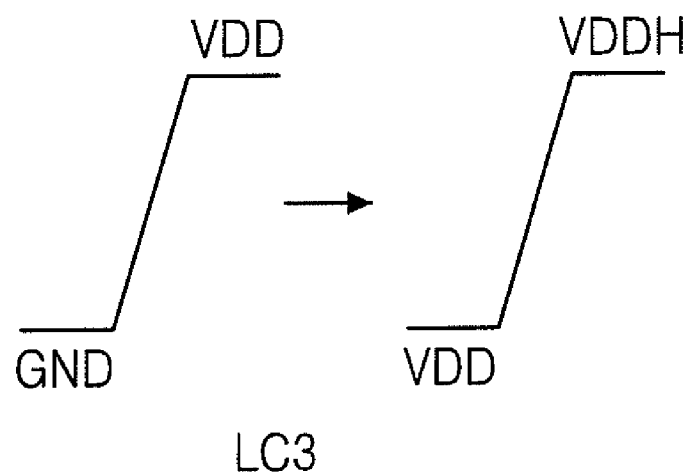

The first level shifter LC1 illustrated in FIG. 6 is the same as that illustrated in FIG. 1. Thus, a description thereof will be omitted. Like the first level shifter LC1, the third level shifter LC3 converts the ground level and the voltage level of the first power supply VDD into the voltage level of the first power supply VDD and the voltage level of the high voltage VDDH, respectively, as illustrated in FIG. 12C.

The transmission controller 250 includes a pull-up switch connected between the pull-up node PU and one output node of the pre-driver 230. The pull-up switch may be implemented by a transmission gate including an NMOS transistor MN2 and a PMOS transistor MP2.

The transmission controller 250 also includes a PMOS transistor MP1 connected between the pull-up node PU and the I/O node NO, a PMOS transistor MP3 connected between a gate of the PMOS transistor MP2 and the I/O node NO, and an NMOS transistor MN3 connected between a connection node, i.e., the receiver input node IR between the first and second pull-down transistors MN0 and MN1 and the gate of the PMOS transistor MP2.

The third level shifter LC3 controls a gate of the NMOS transistor MN2 of the pull-up switch included in the transmission controller 250 and is thus referred to as a switch control level shifter. Gates of the PMOS transistors MP1 and MP3 are connected to the first power supply VDD and a gate of the NMOS transistor MN3 is connected to an output of the inverter INV2.

The timing/level controller 240 may also include two NMOS transistors MN4 and MN5 connected in series between the gate of the PMOS transistor MP2 of the pull-up switch and the second voltage node GND. A gate of the NMOS transistor MN4 is connected to the first power supply VDD and the delayed output enable signal OED is input to a gate of the NMOS transistor MN5. The two NMOS transistors MN4 and MN5 are used to keep a node GP2 at the ground level.

According to the current embodiment of the present inventive concept, the bulk node PB of the pull-up transistor MP0 is pulled up to the voltage level of the high voltage VDDH in the receiving mode, thereby preventing an unwanted current path from being formed through the pull-up transistor MP0. In addition, the gate of the first pull-down transistor MN0 is pulled up to the voltage level of the intermediate voltage VDDM in the receiving mode, thereby increasing the swing level of the I/O node NO. As a result, the swing level of input data is not limited even under low voltage operating conditions. At the transition from the receiving mode to the transmission mode, a voltage at a node GN2, i.e., the gate of the NMOS transistor MN2 of the pull-up switch transits to the voltage level of the high voltage VDDH, thereby transmitting a high-potential charge at the pull-up node PU to the first power supply VDD.

Figure 7:
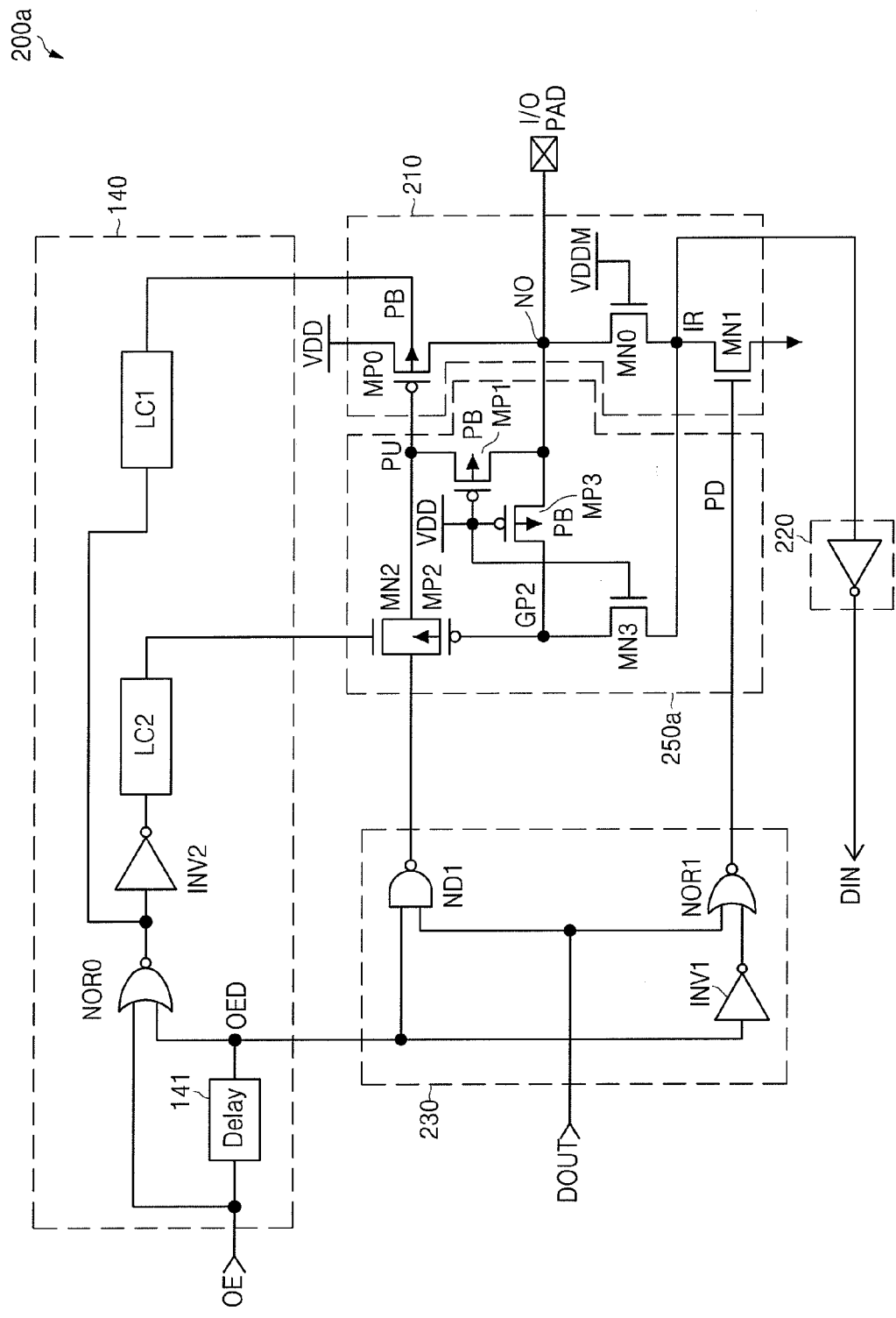
FIG. 7 is a circuit diagram of a modification of the I/O circuit illustrated in FIG. 6.

FIG. 7 is a circuit diagram of a modification 200a of the I/O circuit 200 illustrated in FIG. 6. The I/O circuit 200a is similar to the I/O circuit 200 illustrated in FIG. 6, and therefore, differences therebetween will be mainly described.

The timing/level controller 140 illustrated in FIG. 7 is the same as the timing/level controller 140 illustrated in FIG. 1. Accordingly, the NMOS transistor MN2 of the pull-up switch is controlled by an output of the second level shifter LC2. While the gate of the NMOS transistor MN3 is connected to the output of the inverter INV2 in the I/O circuit 200 illustrated in FIG. 6, it is connected to the first power supply VDD in the I/O circuit 200a illustrated in FIG. 7.

The I/O circuits 200, 200a may be modified as the I/O circuit 100 illustrated in FIG. 1 is modified into the I/O circuit 100c illustrated in FIG. 4. In other words, the gate of the pull-down transistor MN0 may be connected to the first power supply VDD, and the I/O circuits 200, 200a may also include a receiving switch transistor connected between the I/O node NO and the receiver 220 and having a gate receiving the intermediate voltage VDDM. An example of such modification is illustrated in FIG. 8.

Figure 8:
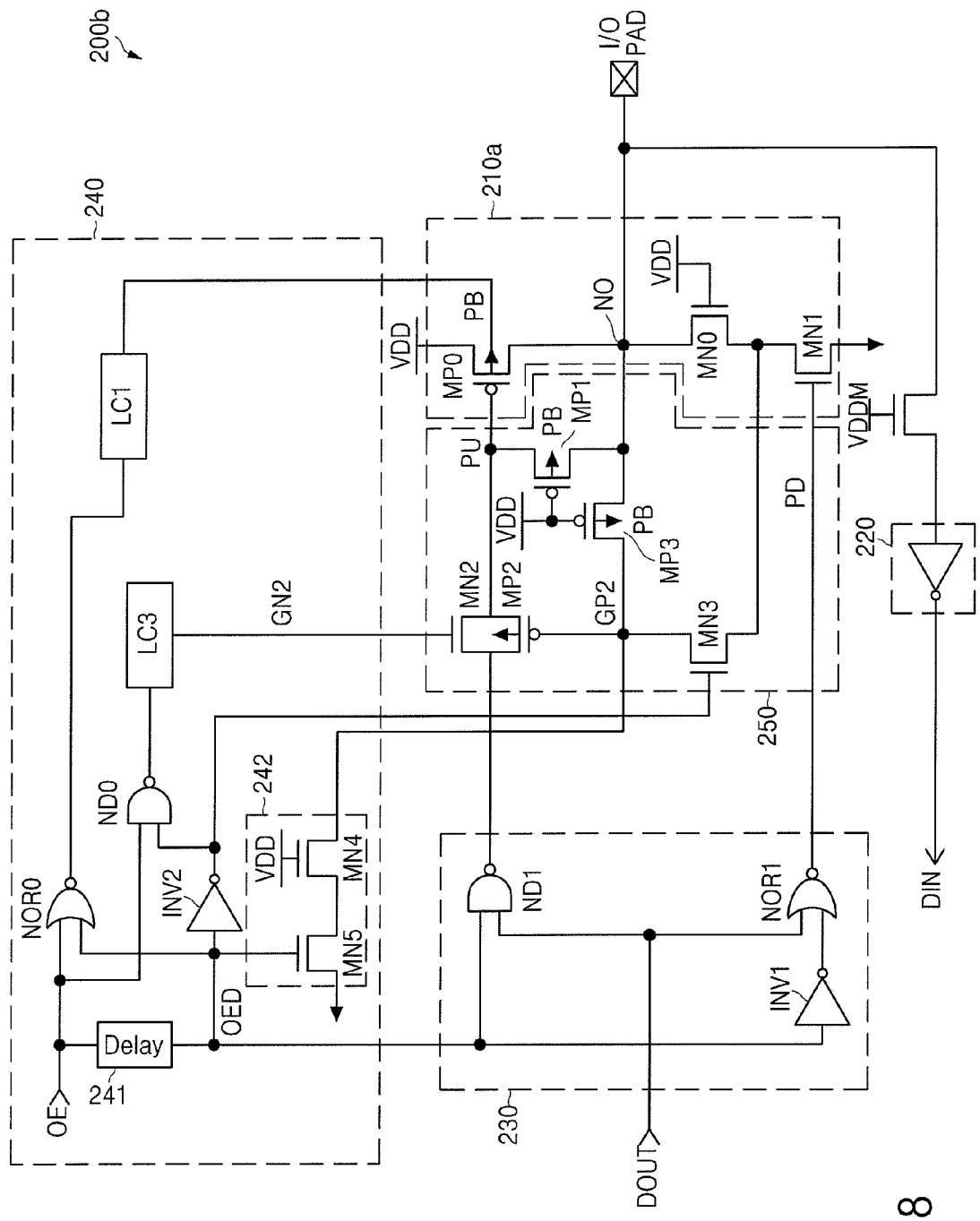
FIG. 8 is a circuit diagram of another modification of the I/O circuit illustrated in FIG. 6.

FIG. 8 is a circuit diagram of another modification 200b of the I/O circuit 200 illustrated in FIG. 6. Compared to the I/O circuit 200 illustrated in FIG. 6, the I/O circuit 200b includes the pre-driver 230, the transmission controller 250, and the timing/level controller 240 the same as those illustrated in FIG. 6 and a transmitter 210a different from the transmitter 210 illustrated in FIG. 6 and further includes a receiving switch transistor. The receiving switch transistor is connected between the I/O node NO and the receiver 220 and has a gate controlled by the intermediate voltage VDDM. Since the gate of the receiving switch transistor has the voltage level of the intermediate voltage VDDM, the receiver input node IR swings between the voltage of the first power supply VDD and the voltage of the second voltage node GND.

Meanwhile, the first pull-down transistor MN0 included in the I/O circuit 200b illustrated in FIG. 8 is not used in the receiving mode, and therefore, the voltage of the first power supply VDD instead of the intermediate voltage VDDM is applied to the gate of the first pull-down transistor MN0. The intermediate voltage VDDM may vary with the voltage level of the first power supply VDD, as described above.

Figure 9:
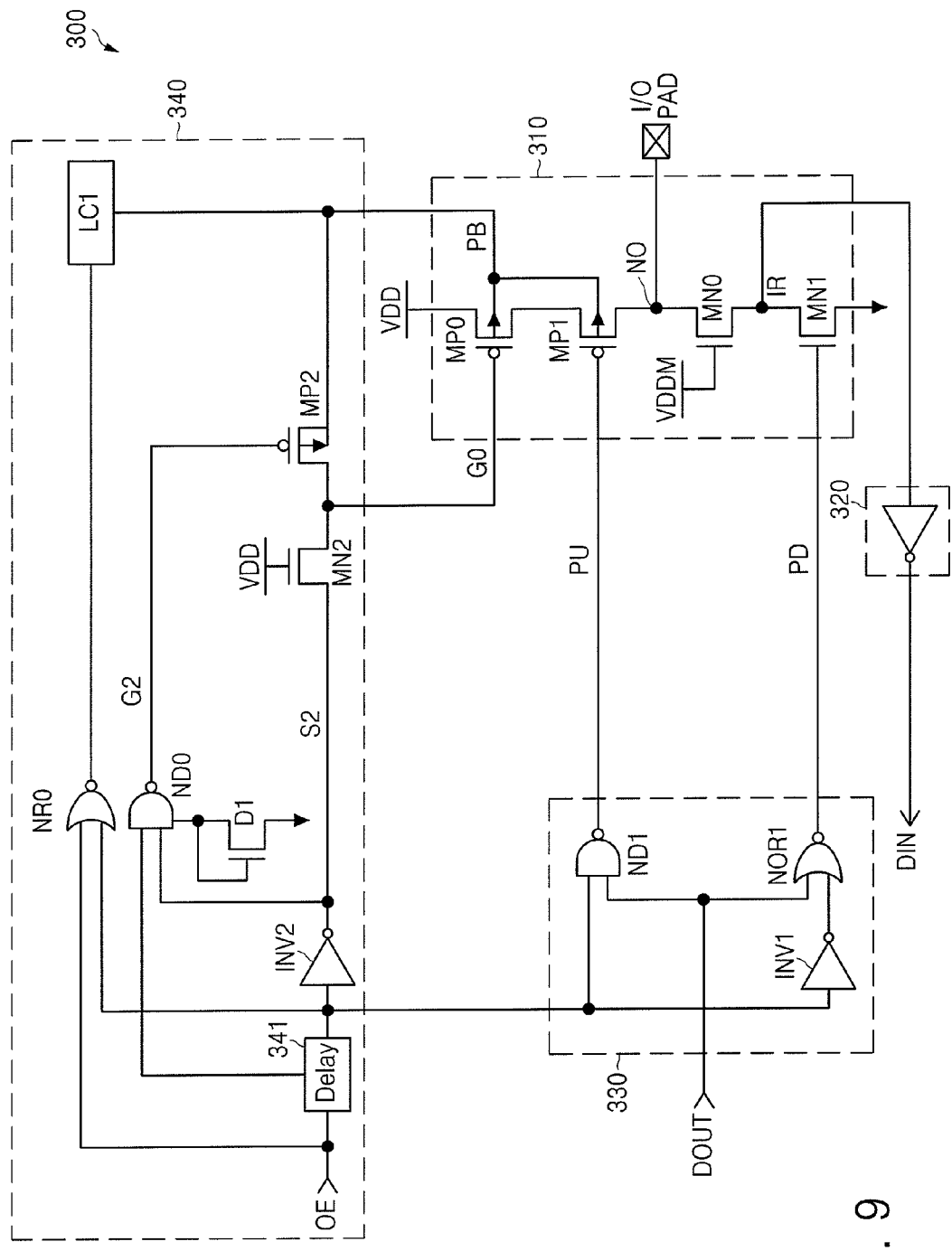
FIG. 9 is a circuit diagram of an I/O circuit according to an exemplary embodiment of the present inventive concept.

FIG. 9 is a circuit diagram of an I/O circuit 300 according to further embodiments of the present inventive concept. The I/O circuit 300 includes a transmitter 310, a receiver 320, a pre-driver 330, and a timing/level controller 340. The pre-driver 330 and the receiver 320 are the same as the pre-driver 130 and the receiver 120 illustrated in FIG. 1. Thus, descriptions thereof will be omitted.

The transmitter 310 includes a first pull-up transistor MP0, a second pull-up transistor MP1, a first pull-down transistor MN0, and a second pull-down transistor MN1. The first and second pull-up transistors MP0, MP1 are connected in series between the first power supply VDD and the I/O node NO. A gate of the second pull-up transistor MP1, i.e., the pull-up node PU is connected to one output of the pre-driver 330. A substrate of the first and second pull-up transistors MP0, MP1, i.e., a common bulk node PB is connected to an output of the first level shifter LC1.

The first and second pull-down transistors MN0, MN1 are connected in series between the I/O node NO and the second voltage node GND. A gate of the first pull-down transistor MN0 is connected to the intermediate voltage VDDM and a gate of the second pull-down transistor MN1 is connected to the other output of the pre-driver 330.

The timing/level controller 340 includes a delay unit 341, a NOR gate NR0, a NAND gate ND0, an inverter INV2, a level shifter LC1, an NMOS transistor MN2, and a PMOS transistor MP2.

At the transition from the receiving mode to the transmission mode, the timing/level controller 340 controls the common bulk node PB of the first and second pull-up transistors MP0, MP1 to have the voltage of the first power supply VDD for a predetermined delay time so that a high-potential charge at the I/O node NO is transmitted to the first power supply VDD and the output data DOUT is then transmitted to an external device through the I/O node NO. In the receiving mode, the timing/level controller 340 controls the common bulk node PB to have the high voltage VDDH. As a result, leakage current is prevented from occurring through the first and second pull-up transistors MP0, MP1.

The delay unit 341 delays the output enable signal OE by a predetermined delay time (e.g., the first delay time) and outputs the delayed output enable signal OED. The inverter INV2 inverts the delayed output enable signal OED.

The NAND gate ND0 performs a NAND operation on a signal generated by the delay unit 341 that delays the output enable signal OE by a second delay time and an output signal of the inverter INV2. At this time, the signal generated by delaying the output enable signal OE by the second delay time may have a different phase than the delayed output enable signal OED.

The PMOS transistor MP2 is controlled by an output signal of the NAND gate ND0 and is connected between a gate, i.e., a node G0 of the first pull-up transistor MP0 and the common bulk node PB. The NMOS transistor MN2 is connected between the inverter INV2 and the node G0, i.e., the gate of the first pull-up transistor MP0 and has a gate connected to the first power supply VDD.

The level shifter LC1 is the same as the first level shifter LC1 described above. In other words, the level shifter LC1 converts the voltage level of the second voltage node GND, i.e., the ground level and the voltage level of the first power supply VDD into the voltage level of the first power supply VDD and the voltage level of the high voltage VDDH, respectively, as illustrated in FIG. 12A. The high voltage VDDH may be double the voltage of the first power supply VDD or similar to a high voltage of an external device interfaced by the I/O circuit 300. The intermediate voltage VDDM and the high voltage VDDH, which are higher than the voltage of the first power supply VDD, may be generated by an internal voltage generator (not shown). The internal voltage generator may include a charge pump.

The high voltage VDDH is used to pull up the bulk node PB in the receiving mode, thereby preventing an unwanted current path from being formed through the first and second pull-up transistors MP0, MP1. In other words, a leakage current path is prevented from being formed through the first and second pull-up transistors MP0, MP1 in the receiving mode. The intermediate voltage VDDM is used to pull up the gate of the first pull-down transistor MN0, thereby achieving low voltage operating conditions. In other words, the intermediate voltage VDDM is used to control the gate of the first pull-down transistor MN0 to increase a limited swing level.

As described above, the intermediate voltage VDDM can be varied considering the reliability of a gate oxide and a low voltage operation. For instance, when the voltage of the first power supply VDD is relatively high, the intermediate voltage VDDM is set to be similar to the voltage of the first power supply VDD to decrease the stress on the gate oxide. When the voltage of the first power supply VDD is relatively low, that is, under the low voltage operating conditions, the intermediate voltage VDDM is set to be equal to or higher (e.g., VDD+Vthn) than the voltage of the first power supply VDD. In addition, the timing control method is used, as described above, to prevent hot-carrier injection that may occur at the transition from the receiving mode to the transmission mode. In other words, when the receiving mode is converted into the transmission mode, a high-potential charge remaining at the I/O pad is discharged before data transmission, thereby preventing the hot-carrier injection.

In a multi-I/O system having a plurality of I/O pads, the timing/level controller 340 may be used in common for all of the I/O pads. As a result, a necessary area is reduced. The operation of the I/O circuit 300 will be described below.

In the transmission mode for transmitting the output data DOUT to an external device, the pull-up node PU and the pull-down node PD are both at a logic high level or a logic low level so that the output data DOUT is transmitted to the I/O pad. When both of the pull-up node PU and the pull-down node PD are at the logic high level, the I/O pad is driven at the voltage of the second voltage node GND. When both of the pull-up node PU and the pull-down node PD are at the low logic level, the I/O pad is driven at the voltage of the first power supply VDD.

The output of the level shifter LC1 has the voltage level of the first power supply VDD and the bulk node PB thus has the voltage level of the first power supply VDD. Accordingly, the body effect of the first and second pull-up transistors MP0, MP1 is prevented. The output enable signal OE is at a logic high level and the output signal of the inverter INV2 is thus at a logic low level. Accordingly, the gate, i.e., the node G0 of the first pull-up transistor MP0 is kept to have the voltage of the second voltage node GND through the NMOS transistor MN2.

The second output data of the pre-driver 330 is transmitted to the pull-down node PD. Accordingly, the second pull-up transistor MP1 and the second pull-down transistor MN1 are selectively turned on in response to the first output data and the second output data, thereby driving the I/O node NO at the voltage of the first power supply VDD (or supplying current to the external device through the I/O node NO) or driving the I/O node NO at the voltage of the second voltage node GND (or sinking current from the I/O node NO to the ground.

Meanwhile, in the receiving mode for receiving input data from an external device, the first and second pull-up transistors MP0, MP1 and the second pull-down transistor MN1 of the transmitter 310 are turned off to transmit the input data received through the I/O pad to the receiver 320. A voltage at the bulk node PB has the voltage level of the high voltage VDDH and is not changed according to the input data. Since the voltage at the bulk node PB is maintained at the voltage level of the high voltage VDDH, a leakage current, i.e., an unwanted current is prevented from occurring through the first and second pull-up transistors MP0, MP1. The node G0 also becomes to have the high voltage VDDH through the PMOS transistor MP2, so that a leakage current is prevented from occurring through the first and second pull-up transistors MP0, MP1.

The pull-up node PU and a node S2 have the voltage of the first power supply VDD and a voltage at the pull-down node PD is at a low level. Accordingly, the second pull-down transistor MN1 is turned off. The gate of the first pull-down transistor MN0 has the intermediate voltage VDDM, and therefore, the receiver input node IR swings between the voltage of the first power supply VDD and the voltage of the second voltage node GND.

Thereafter, when the output enable signal OE is activated and the transmission mode is entered, the bulk node PB has the voltage of the first power supply VDD and a voltage at the node G2 is at a logic low level for a delay time. At this time, the voltage at the node G2 is at about a threshold voltage level due to the NAND gate ND0 and a diode D1 connected between the NAND gate ND0 and the ground. As a result, gate oxide stress at the PMOS transistor MP2 is reduced. Consequently, high-potential charges stored at the I/O pad and the node G0 are transmitted to the first power supply VDD through the PMOS transistors MP0, MP1, and MP2.

As described above, according to the current embodiments of the present inventive concept, the substrate, i.e., the common bulk node PB of the first and second pull-up transistors MP0, MP1 has the high voltage VDDH, thereby preventing a leakage current path. In addition, the intermediate voltage VDDM is changed according to an operating voltage (i.e., the voltage of the first power supply VDD) to increase the swing level of the receiver input node IR under the low voltage operating conditions, thereby reducing the occurrence of errors in receiving data. Also, at the transition from the receiving mode to the transmission mode, a high-potential charge remaining at the I/O pad is discharged using the timing control method, thereby preventing hot-carrier injection.

Figure 10:
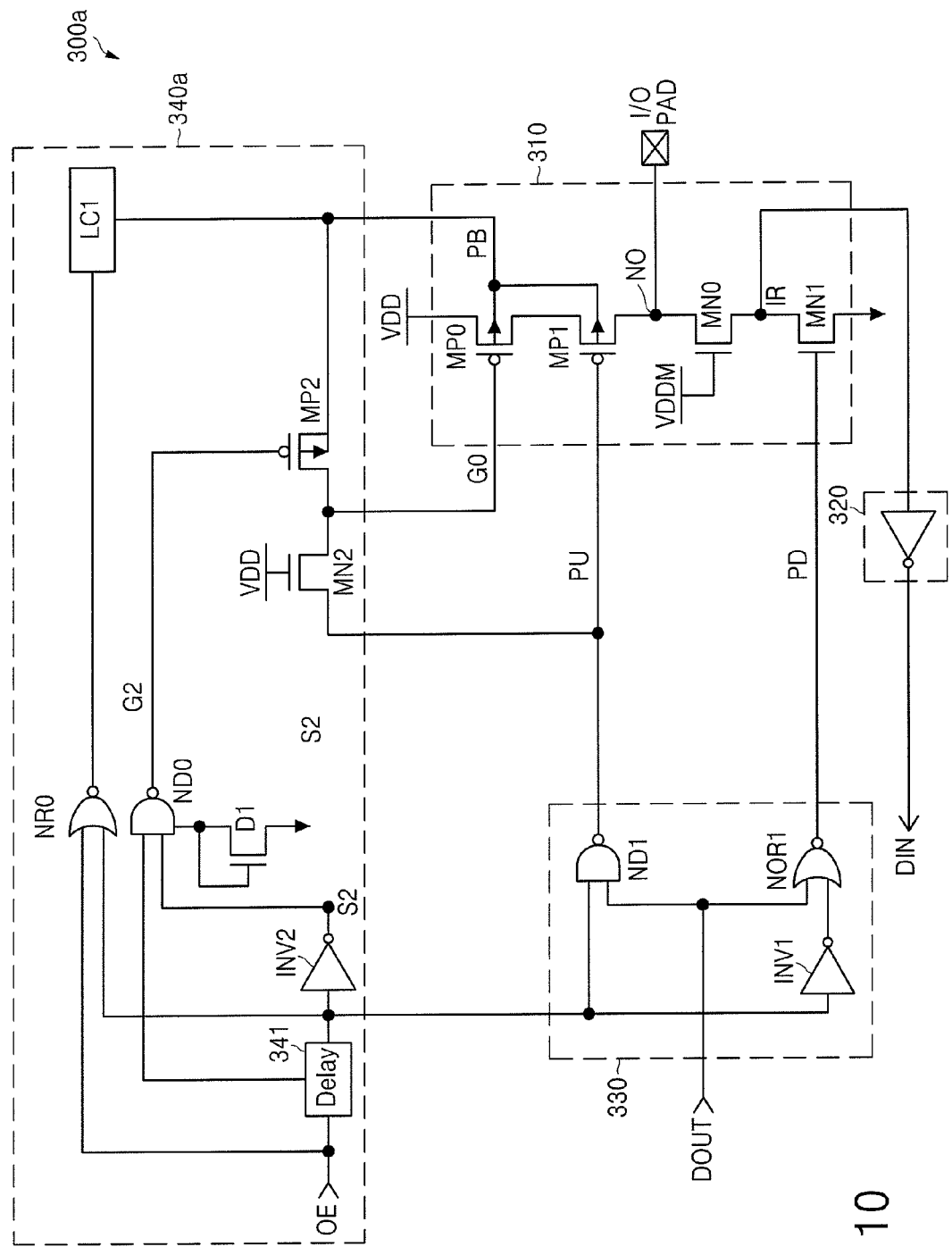
FIG. 10 is a circuit diagram of a modification of the I/O circuit illustrated in FIG. 9.

FIG. 10 is a circuit diagram of a modification 300a of the I/O circuit 300 illustrated in FIG. 9. Referring to FIG. 10, the I/O circuit 300a includes the transmitter 310, the receiver 320, the pre-driver 330, and a timing/level controller 340a. The transmitter 310, the receiver 320, and the pre-driver 330 included in the I/O circuit 300a are the same as those included in the I/O circuit 300 illustrated in FIG. 9, but the timing/level controller 340a included in the I/O circuit 300a is different from the timing/level controller 340 included in the I/O circuit 300. Accordingly, the difference between the I/O circuit 300 and the I/O circuit 300a will be mainly described.

An NMOS transistor MN2 included in the timing/level controller 340a is connected between the pull-up node PU and the gate of the first pull-up transistor MP0, i.e., the node G0 and has a gate connected to the first power supply VDD.

Figure 11:
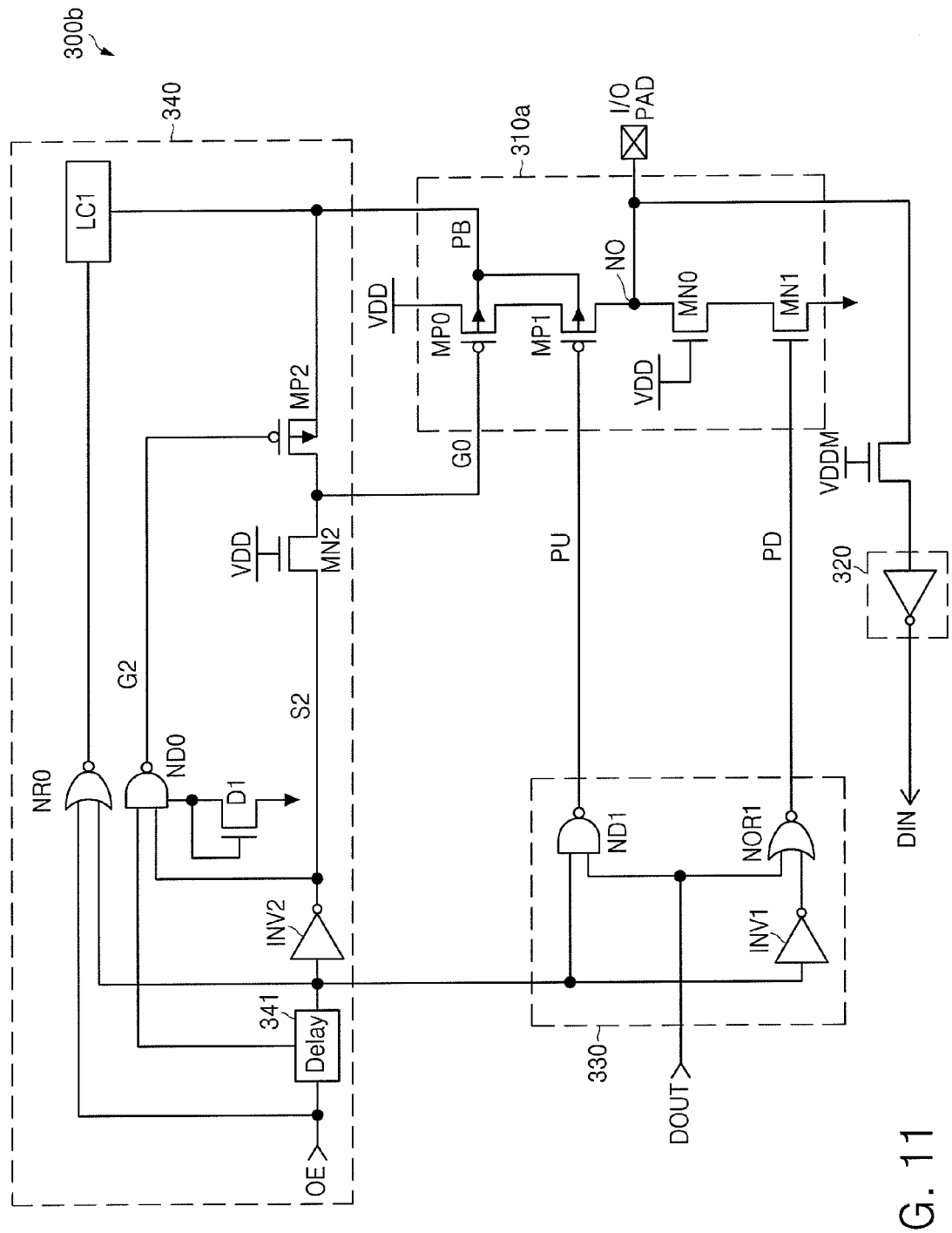
FIG. 11 is a circuit diagram of another modification of the I/O circuit illustrated in FIG. 9.

The I/O circuits 300, 300a may be modified as the I/O circuit 100 illustrated in FIG. 1 is modified into the I/O circuit 100c illustrated in FIG. 4. In other words, the gate of the pull-down transistor MN0 may be connected to the first power supply VDD, and the I/O circuits 300, 300a may also include a receiving switch transistor, which is connected between the I/O node NO and the receiver 320 and has a gate receiving the intermediate voltage VDDM. An example of such modification is illustrated in FIG. 11. As described above, an I/O circuit according to an exemplary embodiment of the present inventive concept can be modified in various ways.

Figure 13:
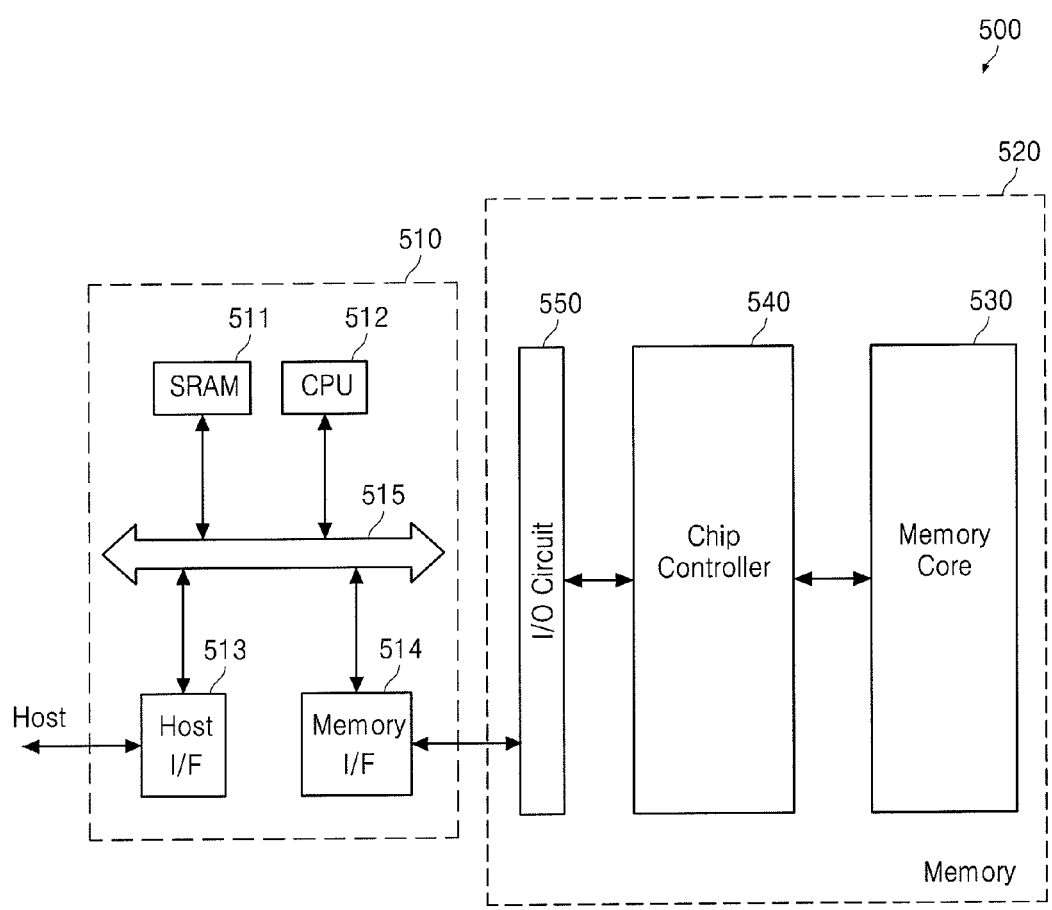
FIGS. 13 and 14 illustrate examples of an integrated circuit (IC) apparatus using an I/O circuit according to an exemplary embodiment of the present inventive concept.
Figure 14:
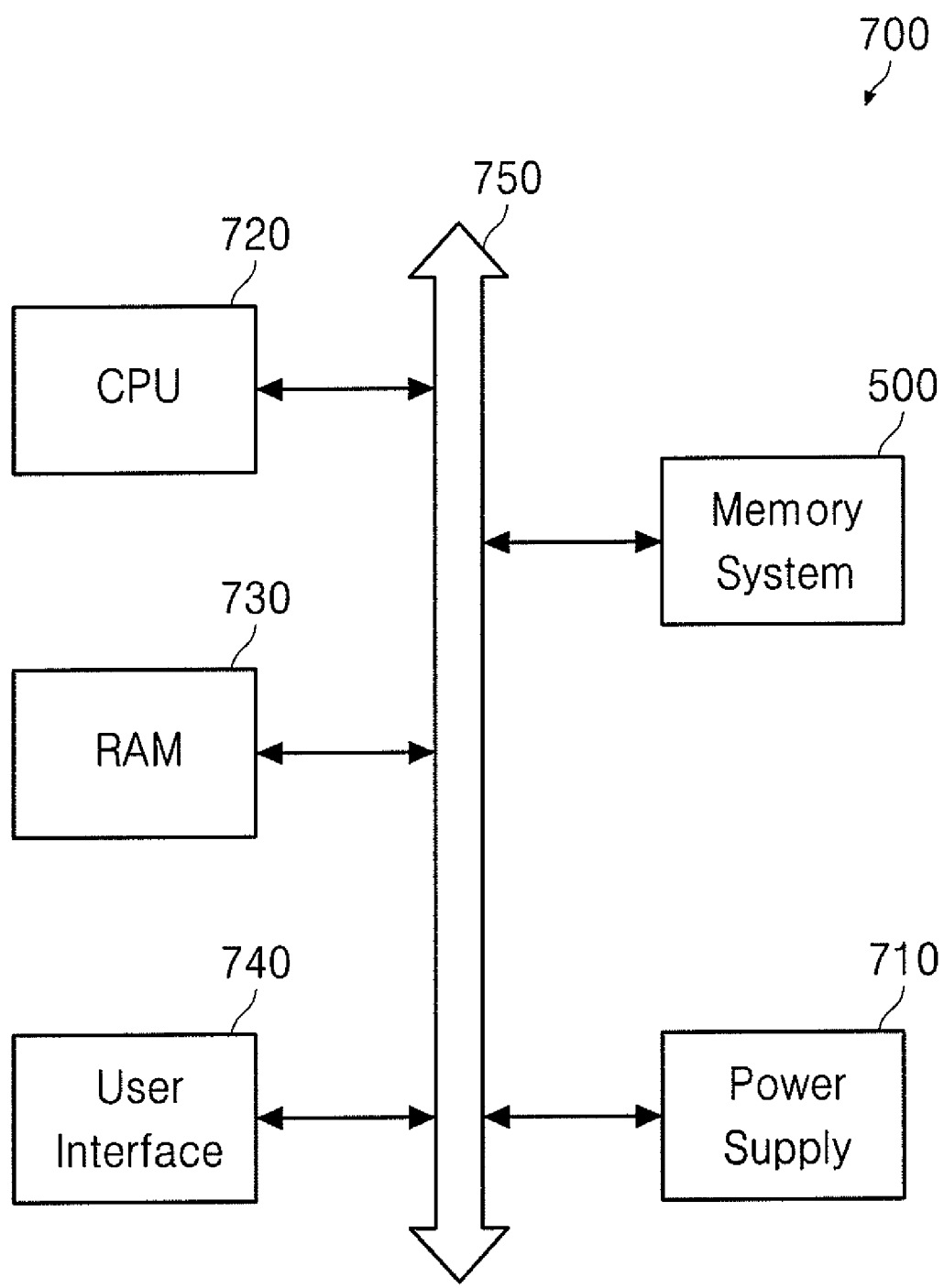

FIGS. 13 and 14 illustrate examples of an integrated circuit (IC) apparatus using an I/O circuit according to at least one exemplary embodiment of the present inventive concept.

FIG. 13 is a block diagram of a memory system 500 according to an exemplary embodiment of the present inventive concept. The memory system includes a memory device 520 and a memory controller 510 controlling the memory device 520. Memory controller 510 includes SRAM 511, CPU 512, host interface 513 and memory interface 514, which communicate over a bus 515. Memory device includes memory core 530 which communicates with chip controller 540, which in turn, communicates with I/O circuit 550 which may be implemented by at least one of the exemplary embodiments of the inventive concept described herein.

A semiconductor memory device or memory module according to an exemplary embodiment of the present inventive concept can also be used in a computing system, for example, mobile equipment or a desktop computer. An example of the computing system is illustrated in FIG. 14. Referring to FIG. 14, a computing system 700 includes the memory system 500 according to an exemplary embodiment of the present inventive concept, a power supply 710, a central processing unit (CPU) 720, a random access memory (RAM) 730, and a user interface 740, which are electrically connected with one another through a system bus 750.

As described above, according to an exemplary embodiment of the present inventive concept, a substrate, i.e., a bulk node of a pull-up transistor has a high voltage, thereby preventing a leakage current path. In addition, an intermediate voltage is changed according to an operating voltage to increase the swing level of a receiver input node under low voltage operating conditions, so that a voltage of receiving data can be reliably secured even in a low voltage operating environment. As a result, the occurrence of errors in the receiving data can be reduced. Furthermore, at the transition from the receiving mode to the transmission mode, a high-potential charge remaining at an I/O pad is discharged using the timing control method before output data is transmitted to an external device, so that hot-carrier injection is prevented. Accordingly, even in the low voltage operating environment, leakage current in the receiving mode, hot-carrier injection at the transition from the receiving mode to the transmission mode, and the decrease in reliability of a gate oxide can be prevented.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. An input/output circuit, comprising:
   an I/O node connected to a pull up and pull down circuit comprising a pull up transistor and a pull down transistor configured to receive a data input from an I/O pad and to send a data output to the I/O pad;
   a level shifter configured to provide various voltages including a supply voltage and a high voltage that is at a higher voltage than the supply voltage; and
   a signal control circuit configured to control a voltage level applied to the pull up and pull down circuit,
   wherein during a data input mode, data is received at the I/O node from the I/O pad and the pull up transistor is biased at the high voltage and during a data output mode, data is output at the I/O node and the pull down transistor is activated to pull down the I/O node to ground when the output data is low, and the pull up transistor is activated when the output data is high,
   wherein the signal control circuit is configured to apply a delay when the data input mode is switched to the data output mode to delay a voltage swing at the I/O node from a high level to a low level.

2. The input/output circuit of claim 1, wherein during the data output mode the level shifter is configured to apply the supply voltage at the substrate of the pull up transistor.

3. The input/output circuit of claim 1, wherein during the data output mode the signal control circuit is configured to apply gate voltage to the pull up transistor that swings between the supply voltage and a low level to activate the pull up transistor when the output data voltage is high.

4. The input/output circuit of claim 1, wherein during the data input mode the level shifter configured to apply the high voltage to the substrate of the pull up transistor.

5. The input/output circuit of claim 1, wherein the signal control circuit is configured to apply to the gate of the pull-down transistor an intermediate voltage that is equal to or greater than the supply voltage.

6. An I/O circuit comprising:
   a transmitter that comprises at least one pull-up transistor connected between a first voltage node having a first power supply voltage and an I/O node and at least one pull-down transistor connected between the I/O node and a second voltage node to transmit output data to an external device through the I/O node;
   a receiver that receives input data through the I/O node; and
   a timing/level controller configured to selectively apply a second voltage in a receiving mode to a bulk node of the at least one pull-up transistor, and that controls the bulk node to have the second voltage which is higher than the first power supply voltage,
   wherein a gate of the at least one pull-down transistor is biased at an intermediate voltage which is a voltage level between the first power supply voltage and the second voltage.

7. The I/O circuit of claim 6, wherein the at least one pull-down transistor comprises a first pull-down transistor and a second pull-down transistor connected in series, the second pull-down transistor being connected to the second voltage node.

8. The I/O circuit of claim 6 wherein the at least one pull-up transistor comprises a first pull-up transistor and a second pull-up transistor connected in series, the second pull-up transistor being coupled to the I/O node.

9. The I/O circuit of claim 6, wherein the timing/level controller is configured to apply a delay when the data input mode is switched to the data output mode to make a voltage level of the bulk node change from a high level to a low level before transmitting output data to the external device through the I/O node.

10. The I/O circuit of claim 6, further comprising:
a transistor coupled between the bulk node and a gate of the at least one pull-up transistor; and
a diode coupled between a gate of the transistor and a second voltage node,
wherein the diode is configured to prevent a voltage difference between the gate and the source of the transistor from increasing and a gate voltage of the transistor from being higher than the first power supply voltage.

11. The I/O circuit of claim 10,
wherein the at least one pull-up transistor comprises a first pull-up transistor and a second pull-up transistor connected in series; and
wherein the transistor is coupled between the bulk node and the gate of the first pull-up transistor.

12. The I/O circuit of claim 11, further comprising a receiving switch transistor connected between the I/O node and the receiver, the receiving switch transistor being configured to control a voltage swing at the receiver.

13. The I/O circuit of claim 11, wherein the timing/level controller further comprises a pull-up switch transistor connected to the gate of the first pull-up transistor and the gate of the second pull-up transistor.

14. The I/O circuit of claim 6, wherein the timing/level controller further comprises:
a first level shifter that converts a level of a signal obtained by performing a logic operation on an output enable signal and a delayed output enable signal resulting from delaying the output enable signal and outputs a level-shifted signal to the bulk node.

15. The I/O circuit of claim 6,
wherein the at least one pull-down transistor comprises a first pull-down transistor and a second pull-down transistor connected in series, and
wherein the I/O circuit further comprises a pre-driver that generates a pull-up signal and a pull-down signal based upon a delayed output enable signal and the output data and that outputs the pull-up signal and the pull-down signal to a pull-up node corresponding to a gate of the at least one pull-up transistor and a pull-down node corresponding to a gate of the second pull-down transistor, respectively.

16. The I/O circuit of claim 14,
wherein the first level shifter is configured to convert a voltage level of the second voltage node into the voltage level of the first power supply voltage, and a voltage level of the first power supply voltage into a voltage level of a high voltage, and
wherein the high voltage is higher than the first power supply voltage.

17. The I/O circuit of claim 6, wherein the second voltage node is at a ground voltage.

18. The I/O circuit of claim 15, further comprising a transmission controller connected between the pre-driver and the at least one pull-up transistor and the at least one pull-down transistor to control output data transmission to the external device through the I/O node.

19. The I/O circuit of claim 18,
wherein the transmission controller comprises a pull-up switch coupled between the at least one pull-up transistor and the pre-driver.

20. The I/O circuit of claim 19, wherein the timing/level controller comprises a switch control level shifter configured to control the pull-up switch for transmitting the output data to the external device through the I/O node.

21. The I/O circuit of claim 20, wherein the switch control level shifter is configured to convert a voltage level of the first power supply voltage into the intermediate voltage level between the first power supply voltage and the high voltage and to convert a voltage level of the second voltage node into a voltage level of the first power supply voltage.

22. The I/O circuit of claim 21, wherein the pull-up switch is a transmission gate.

23. The I/O circuit of claim 19, wherein the timing/level controller comprises a transmission gate level shifter configured to control the transmission gate voltage for transmitting the output data to the external device through the I/O node.

24. The I/O circuit of claim 21,
wherein the transmission gate level shifter is configured to convert a voltage level of the second voltage node into the voltage level of the first power supply voltage, and a voltage level of the first power supply voltage into a voltage level of a high voltage, and
wherein the high voltage is higher than the first power supply voltage.

25. A memory system, comprising:
a memory controller having a memory interface; and
a memory device having a memory an input/output circuit that communicates with the memory interface,
wherein the input/output circuit comprises:
a transmitter that comprises at least one pull-up transistor connected between a first voltage node having a first power supply voltage I/O node and at least one pull-down transistor connected between the I/O node and a second voltage node to transmit output data to the memory interface through the I/O node;
a receiver that receives input data from the memory interface through the I/O node; and
a timing/level controller configured to selectively apply a second voltage in a receiving mode to a bulk node of the at least one pull-up transistor, and that controls the bulk node to have the second voltage which is higher than the first power supply voltage.

26. The memory system of claim 25, wherein the output data is transmitted to and the input data is received from a chip controller in the memory device.

27. A computing system, comprising:
a central processing unit; and
a memory system communicable with the central processing unit over a system bus,
wherein the memory system comprises:
a memory controller having a memory interface; and
a memory device having a memory and an input/output circuit that communicates with the memory interface,
wherein the input/output circuit comprises:
a transmitter that comprises at least one pull-up transistor connected between a first voltage node having a first power supply voltage and an I/O node and at least one pull-down transistor connected between the I/O node and a second voltage node to transmit output data to the system bus through the I/O node;

a receiver that receives input data from the system bus through the I/O node; and a timing/level controller configured to selectively apply a second voltage in a receiving mode to a bulk node of the at least one pull-up transistor, and that controls the bulk node to have the second voltage which is higher than the first power supply voltage.

* * * * *